United States Patent
Vallabhaneni et al.

(10) Patent No.: US 10,523,272 B2
(45) Date of Patent: Dec. 31, 2019

(54) DISTRIBUTED DIFFERENTIAL INTERCONNECT

(71) Applicant: QUALCOMM Incorporated, San Diego, CA (US)

(72) Inventors: Madhukar Vallabhaneni, Bangalore (IN); Girish Koppassery, Bangalore (IN); Xinhua Chen, San Diego, CA (US); Jingcheng Zhuang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/606,820

(22) Filed: May 26, 2017

(65) Prior Publication Data
US 2018/0343032 A1    Nov. 29, 2018

(51) Int. Cl.
| | | |
|---|---|---|
| H04B 3/28 | (2006.01) | |
| H04L 25/08 | (2006.01) | |
| H05K 1/02 | (2006.01) | |
| H01R 9/03 | (2006.01) | |
| H01R 9/11 | (2006.01) | |
| H01R 11/05 | (2006.01) | |
| H01R 12/70 | (2011.01) | |
| H01R 12/77 | (2011.01) | |
| H01R 12/00 | (2006.01) | |

(Continued)

(52) U.S. Cl.
CPC ............... *H04B 3/28* (2013.01); *H01R 9/034* (2013.01); *H01R 9/11* (2013.01); *H01R 11/05* (2013.01); *H01R 12/00* (2013.01); *H01R 12/7076* (2013.01); *H01R 12/775* (2013.01); *H04L 25/00* (2013.01); *H04L 25/0274* (2013.01); *H04L 25/085* (2013.01); *H05K 1/0233* (2013.01)

(58) Field of Classification Search
CPC .. H04B 3/28; H03H 7/38; H05K 2201/09236; H05K 1/0237
USPC .................. 333/12, 1, 4, 5, 238, 33
See application file for complete search history.

(56) References Cited

U.S. PATENT DOCUMENTS

| | | |
|---|---|---|
| 6,417,463 B1 | 7/2002 | Cornelius et al. |
| 6,909,127 B2 | 6/2005 | O'Mahony et al. |

(Continued)

OTHER PUBLICATIONS

International Search Report and Written Opinion—PCT/US2018/028368—ISA/EPO—dated Aug. 10, 2018.

*Primary Examiner* — Stephen E. Jones
(74) *Attorney, Agent, or Firm* — Colby Nipper

(57) ABSTRACT

An electronic apparatus is disclosed that implements a distributed differential interconnect. In an example aspect, the electronic apparatus includes a first endpoint having a first differential connection interface and a second endpoint having a second differential connection interface. The electronic apparatus also includes a differential interconnect coupled between the first differential connection interface and the second differential connection interface. The differential interconnect includes a plus pathway and a minus pathway. The plus pathway extends between the first differential connection interface and the second differential connection interface, with the plus pathway including multiple plus conductors. The minus pathway extends between the first differential connection interface and the second differential connection interface, with the minus pathway including multiple minus conductors.

30 Claims, 15 Drawing Sheets

(51) Int. Cl.
*H04L 25/00* (2006.01)
*H04L 25/02* (2006.01)

(56) References Cited

U.S. PATENT DOCUMENTS

| | | |
|---|---|---|
| 7,002,249 B2 | 2/2006 | Duffy et al. |
| 8,084,857 B2 | 12/2011 | Appel et al. |
| 8,643,184 B1 | 2/2014 | Zhang et al. |
| 2007/0146175 A1 | 6/2007 | Kim et al. |
| 2013/0333913 A1 | 12/2013 | Nonen et al. |
| 2014/0209343 A1* | 7/2014 | Gundel ............... H01B 7/0838 174/34 |
| 2016/0027554 A1* | 1/2016 | Maeda ............... H01R 13/6467 174/74 R |

* cited by examiner

DISTRIBUTED DIFFERENTIAL INTERCONNECT

TECHNICAL FIELD

This disclosure relates generally to differential interconnects used in electronic devices and, more specifically, to distributing a differential interconnect across multiple plus conductors and multiple minus conductors to reduce differential inductance or inductive coupling.

BACKGROUND

Electronic devices, such as computers and smart phones, provide modern conveniences by processing information. The functionality of many electronic devices can therefore be augmented today via wireless connectivity that enables information to be communicated wirelessly. Wireless connectivity enables an electronic device to receive information from other sources, such as the Internet, and to share information obtained by the electronic device. An even more-connected environment is expected to bring enhancements in the future to the features offered by electronic devices. For example, the Internet of Things (IoTs) is expected to provide a pervasive wireless network for many different types of electronic devices to connect to.

Things as diverse as buildings, cars, and refrigerators, in addition to more traditional computing devices like smart phones and notebook computers, are expected to connect to the Internet of Things. New capabilities will likely include buildings that are aware of when an occupant is approaching so that the building can turn on lights as well as heating, ventilation, and air conditioning (HVAC) services. Also, self-driving cars will communicate with other vehicles to avoid accidents and facilitate a more efficient usage of roads and highways. Refrigerators will be able to keep fresh staples stocked automatically. Additionally, smart phones and intelligent glasses will be able to provide augmented reality views that are overlaid on everyday life.

However, to enable such benefits that derive from Internet of Things (IoTs) technologies, wireless networks will rely on higher frequencies to provide greater communication bandwidth. For example, usage of significantly higher transmission frequencies, including those over 10 GHz, are planned for future wireless communication technologies, such as those for 5th generation (5G) wireless systems. Deployment of 5G wireless networks is expected to enable a wealth of new communication opportunities, including those for Internet of Things technologies, the sharing of three-dimensional (3D) visual data, the provisioning of real-time augmented reality, and so forth.

To enable the higher communication frequencies of 5G wireless networks, electronic devices are to operate at these higher frequencies. Unfortunately, operating electronic devices at higher frequencies introduces new challenges. These new challenges impact, for instance, the operation of interconnects within electronic devices at these higher frequencies. Interconnects enable information to be transferred within an electronic device. Operation of a conventional differential interconnect, for example, is adversely impacted by higher frequencies. As frequencies increase, a conventional differential interconnect becomes less able to operate within desired performance parameters. Consequently, conventional differential interconnects are unable to respond to the new challenges presented by the forthcoming 5G wireless technologies.

SUMMARY

An electronic apparatus is disclosed that implements a distributed differential interconnect. In an example aspect, the electronic apparatus includes a first endpoint, a second endpoint, and a differential interconnect. The first endpoint has a first differential connection interface. The second endpoint has a second differential connection interface. The differential interconnect is coupled between the first differential connection interface and the second differential connection interface. The differential interconnect includes a plus pathway and a minus pathway. The plus pathway includes multiple plus conductors and extends between the first differential connection interface and the second differential connection interface. The minus pathway includes multiple minus conductors and extends between the first differential connection interface and the second differential connection interface.

In an example aspect, an electronic apparatus is disclosed. The electronic apparatus includes a first endpoint and a second endpoint. The first endpoint includes a differential driver configured to drive a differential signal. The second endpoint includes a differential receiver configured to receive the differential signal. The electronic apparatus also includes means for propagating the differential signal between the first endpoint and the second endpoint via multiple plus conductors and multiple minus conductors.

In an example aspect, a method for propagating a differential signal via a distributed differential interconnect is disclosed. The method includes generating a plus signal of the differential signal and generating a minus signal of the differential signal. The method also includes driving the plus signal onto multiple plus conductors of the distributed differential interconnect. The method additionally includes driving the minus signal onto multiple minus conductors of the distributed differential interconnect. The method further includes receiving the differential signal via the multiple plus conductors and the multiple minus conductors.

In an example aspect, an integrated circuit is disclosed. The integrated circuit includes a plus input node, a minus input node, a plus output node, and a minus output node. The integrated circuit also includes a differential interconnect. The differential interconnect includes a first conductor, a second conductor, a third conductor, and a fourth conductor. The first conductor has a plus polarity and is coupled between the plus input node and the plus output node. The second conductor has a minus polarity and is coupled between the minus input node and the minus output node. The second conductor is disposed adjacent to the first conductor. The third conductor has the plus polarity and is also coupled between the plus input node and the plus output node. The third conductor is disposed adjacent to the second conductor. The fourth conductor has the minus polarity and is also coupled between the minus input node and the minus output node. The fourth conductor is disposed adjacent to the third conductor.

DETAILED DESCRIPTION

Figure 1:
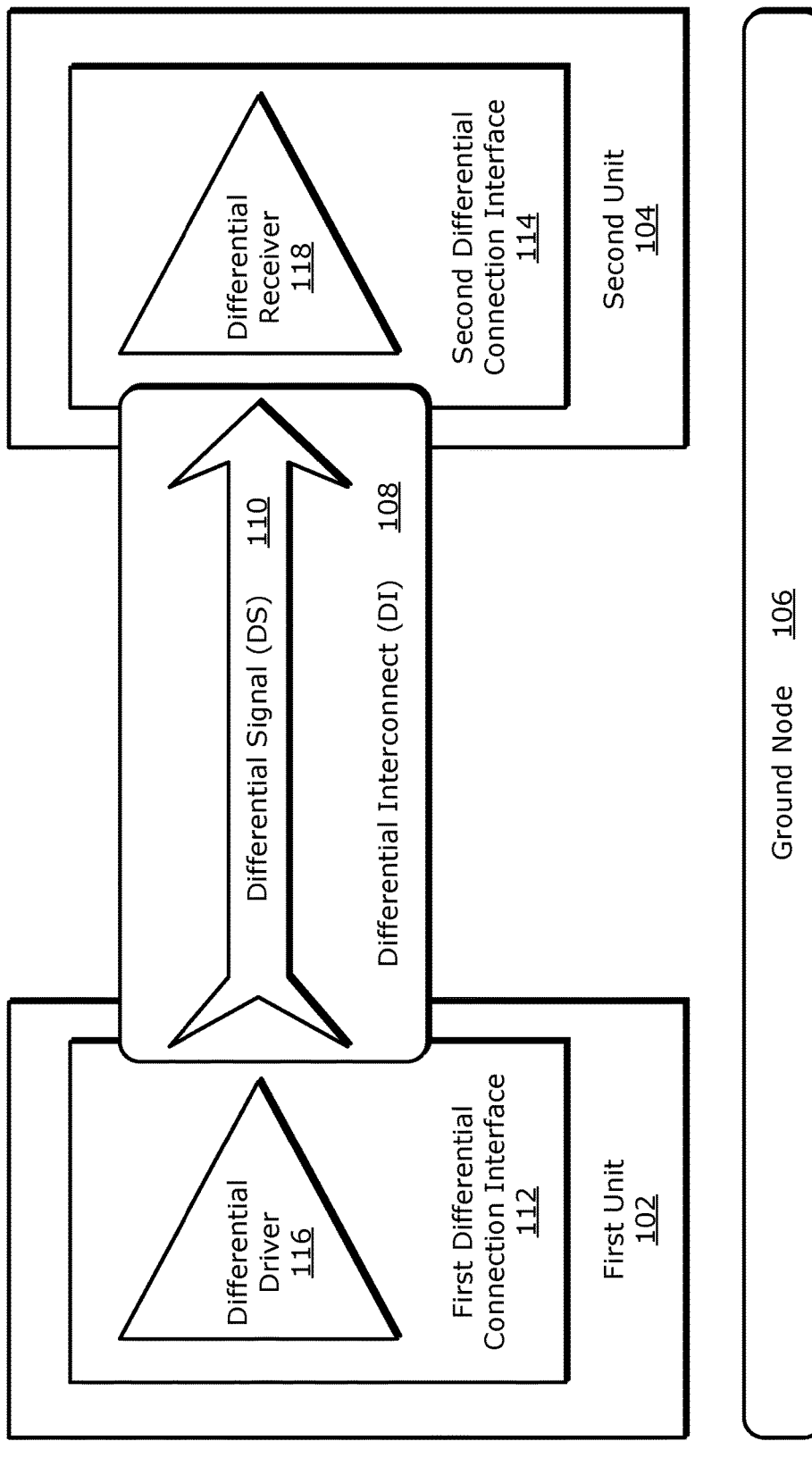
FIG. 1 illustrates an example differential system including a first unit having a differential driver, a second unit having a differential receiver, and a differential interconnect extending between the first and second units.

Across a range of frequencies, electronic devices use interconnects to communicate signals internally. Electronic devices encode information as a signal using a voltage or a current. Thus, information can be processed by changing voltages on, or moving currents around, an electronic device. As part of information processing generally, the electronic device propagates signals along an interconnect between two endpoints of a circuit. Signals can be propagated along these interconnects using single-ended signaling or double-ended signaling. Double-ended signaling is also called differential signaling.

Single-ended signaling is generally simpler than differential signaling because of the number of pathways that are involved. Single-ended signaling can be implemented using two pathways for an interconnect, one for the signal and one for a ground. Differential signaling, on the other hand, can be implemented using three pathways for an interconnect, two for the signal and one for a ground. Implementing differential signaling therefore involves using more pathways than single-ended signaling. Furthermore, because the same ground can often be used with multiple interconnects, differential signaling effectively involves twice as many pathways as single-ended signaling.

With single-ended signaling, information is encoded via a single signal pathway using a voltage or current with reference to the ground. One driver generates the signal on the single signal pathway. Single-ended signaling is therefore simpler for this reason. Furthermore, because one pathway is used instead of two pathways, single-ended signaling occupies a smaller area of a substrate, such as an integrated circuit (IC) or a printed circuit board (PCB), of an electronic device. Hence, single-ended signaling is typically less expensive to implement as compared to differential signaling.

With differential signaling, information is encoded via two signal pathways with reference to each other. For example, the information can be encoded as a difference between voltage or current levels of the two signal pathways. Two signal drivers are employed for differential signaling over the two signal pathways. Differential signaling is therefore more complicated and occupies more area than single-ended signaling. Consequently, differential signaling is typically more expensive to implement.

Nevertheless, differential signaling offers a number of advantages over single-ended signaling. For example, differential signaling is more resistant to electromagnetic interference (EMI). EMI affects the pathways of both differential signaling and single-ended signaling. With differential signaling, however, the EMI tends to affect the two signal pathways similarly such that the difference between the respective voltage or current levels of the two respective signal pathways remains substantially the same in the absence or in the presence of EMI. Thus, information carried on an interconnect by differential signaling is more robust in the presence of EMI as compared to information carried on an interconnect by single-ended signaling.

Additionally, a differential interconnect can be operated at lower current or voltage levels as compared to a single-ended interconnect. With lower voltage levels, for instance, power consumption is reduced, and higher operating frequencies can be permitted. With higher operating frequencies, a higher rate of information transmission can be enabled along an interconnect. Thus, differential interconnects may appear to be appropriate for the significantly higher operating frequencies planned for 5G wireless networks. Unfortunately, as operating frequencies increase, differential inductance also increases, and differential inductance causes signaling problems, as is explained below.

In short, single-ended signaling and differential signaling each have advantages and disadvantages relative to the other. A single-ended interconnect has one driver for one signaling pathway and consumes a smaller area on a given substrate, such as an integrated circuit or a printed circuit board. Implementing single-ended signaling is therefore typically simpler and less expensive than implementing differential signaling. A differential interconnect, however, is more resistant to interference. Further, a differential interconnect can operate at lower voltage levels, which reduces power consumption and facilitates operation at relatively higher frequencies. Consequently, differential signaling appears to be useful for scenarios involving high frequency operation.

For example, a differential interconnect can be implemented as part of a high-frequency phase-locked loop (PLL). Phase-locked loops are used for clock synchronization, signal demodulation, frequency synthesis, and so forth. Phase-locked loops employ a number of components, including a phase frequency detector, a charge pump, and a filter having a capacitor. A differential interconnect can be used between any two of these components, such as to couple the charge pump to the capacitor of the filter. Although the low-voltage capability of differential interconnects is helpful in the context of high-frequency operation, one characteristic of conventional differential interconnects—differential inductance—is incompatible with using differential signaling at high frequencies.

A conventional differential interconnect includes a plus pathway and a minus pathway. The plus pathway and the minus pathway each include one conductor that carries a respective part of a differential signal. Differential inductance arises from the interaction between the plus pathway and the minus pathway as a differential signal propagates along the differential interconnect at some particular frequency. The differential inductance degrades the ability of the differential interconnect to propagate the signal at the particular frequency. Moreover, the higher the frequency, the more the differential inductance adversely affects the differential signal. Consequently, as operating frequencies increase, the differential inductance of a conventional differential interconnect makes using differential signaling increasingly difficult.

Consider, for example, the phase-locked loop scenario in which a conventional differential interconnect couples the capacitor of the filter to the charge pump. The differential inductance of the conventional differential interconnect degrades the rise and fall times of the current pulses generated by the charge pump. This degradation increases a settling time of the current and creates a ringing in the current, which increases a non-linearity of the output of the charge pump. The increased settling time can be partially addressed by increasing the "on" time of the charge pump, but this approach unfortunately intensifies problems with noise. Thus, a conventional differential interconnect has a differential inductance value that causes performance problems, especially when operations occur at higher frequencies.

In contrast, example implementations for a distributed differential interconnect are described herein. A distributed differential interconnect also includes a plus pathway and a minus pathway. However, the plus pathway includes multiple plus conductors, and the minus pathway includes multiple minus conductors. Further, in some implementations, individual plus conductors of the multiple plus conductors are interleaved with individual minus conductors of the multiple minus conductors. The results or consequences of implementing an interleaved, distributed arrangement for a differential interconnect are explained below.

A differential signal includes two portions: a plus signal and a minus signal. In operation, a plus driver distributes the plus signal across the multiple plus conductors as the plus signal is driven down the plus pathway. Similarly, a minus driver distributes the minus signal across the multiple minus conductors as the minus signal is driven down the minus pathway. By distributing the plus signal across the multiple plus conductors and the minus signal across the multiple minus conductors, a resulting differential inductance of the distributed differential interconnect is reduced.

Generally, differential inductance can be reduced through one of two mechanisms. First, differential inductance can be reduced by reducing a self-inductance of each plus pathway or each minus pathway. Second, differential inductance can be reduced by increasing a coupling coefficient towards unity with respect to both the plus and minus pathways. A distributed differential interconnect can achieve a lowered differential inductance through either or both mechanisms.

To reduce the self-inductance of a given pathway, an interleaved arrangement of a distributed differential interconnect reduces a coupling coefficient between pairs of conductors of a same given polarity (e.g., two plus conductors or two minus conductors). To increase a coupling coefficient towards unity with respect to a plus pathway and a minus pathway in combination, a coupling coefficient is increased toward unity between pairs of conductors of different polarities (e.g., a plus conductor and a minus conductor) based on the interleaved arrangement of plus conductors and minus conductors. The interaction between and among interleaved plus conductors and minus conductors that results in a reduction of the differential inductance is described further herein.

Furthermore, implementations of a distributed differential interconnect can provide an additional inductive advantage: the inductive coupling to external pathways or interconnects is reduced. An external coupling coefficient is reduced due to two factors. First, interleaved plus and minus conductors generate magnetic flux that tends to be subtractive away from the plus and minus conductors. Second, by distributing current flows across multiple conductors, the outer-most conductors of a distributed differential interconnect have less flowing current than the "outer-most" conductors of a conventional differential interconnect that only includes two conductors. Accordingly, the inductive coupling to external pathways and interconnects is reduced with an interleaved distributed differential interconnect. By reducing an external coupling coefficient using a distributed differential interconnect, a pathway that is external to the differential interconnect can be placed closer to the differential interconnect at given level of inductive coupling.

In these manners, a distributed differential interconnect can be implemented so as to lower a differential inductance that affects a propagating differential signal. Consequently, differential signaling can be operated at higher frequencies before the differential inductance adversely impacts a circuit. For example, using a distributed differential interconnect between a charge pump and a capacitor of a phase-locked loop improves the linearity of the output of the charge pump, including at higher frequencies. The linearity is increased without increasing the "turn on" time of the charge pump. In this scenario, implementation of a distributed differential interconnect therefore effectively enables the charge pump to operate faster because the linear range of the charge pump is extended into higher frequencies.

FIG. 1 illustrates an example differential system 100 including a first unit 102 having a differential driver 116, a second unit 104 having a differential receiver 118, and a differential interconnect 108 (DI) extending between the first unit 102 and the second unit 104. The differential system 100 can be incorporated into part of an integrated circuit (IC), a printed circuit board (PCB), or another environment configured to propagate signals between two endpoints. The differential system 100 also includes a ground node 106. The ground node 106, or ground, can be realized as a ground pathway, a ground plane, and so forth. The ground node 106 represents a zone of equipotential in the system.

As illustrated, the first unit 102 includes a first differential connection interface 112, and the second unit 104 includes a second differential connection interface 114. The differential interconnect 108 couples the first differential connection interface 112 to the second differential connection interface 114, and vice versa. A differential signal 110 (DS) propagates over the differential interconnect 108 between the first differential connection interface 112 and the second differential connection interface 114. The first differential connection interface 112 includes the differential driver 116, and the second differential connection interface 114 includes the differential receiver 118. The first differential connection interface 112 includes two input nodes, and the second differential connection interface 114 includes two output nodes. These four nodes are described below with reference to FIG. 4.

The first unit 102 and the second unit 104 can each be realized as a group of circuit elements or circuitry that is configured to perform some function. In an example implementation, the first unit 102 is realized as a voltage supply or low-dropout (LDO) regulator, and the second unit 104 is realized as at least one decoupling capacitor. In another example implementation, the first unit 102 is realized as a low-noise amplifier (LNA), and the second unit 104 is realized as a frequency mixer. Here, implementing a differential interconnect 108 between the low-noise amplifier and the frequency mixer can reduce local oscillator (LO) leakage at the frequency mixer. In yet another example implementation, the first unit 102 is realized as a charge pump in a phase-locked loop (PLL), and the second unit 104 is realized as a PLL loop-filter capacitor. In such an environment, a conventional differential interconnect can have an appreciable differential inductance that significantly degrades the linearity of the charge pump. As described herein, the differential inductance can be reduced by deploying a distributed differential interconnect to decrease non-linearity of the charge pump.

In operation, the differential driver 116 drives the differential signal 110 onto or over the differential interconnect 108 from the first differential connection interface 112 to the second differential connection interface 114. At the second differential connection interface 114, the differential receiver 118 receives the differential signal 110 via the differential interconnect 108. Thus, as is shown in FIG. 1, communication or signaling is enabled from the first unit 102 to the second unit 104. However, communication or signaling can also be enabled from the second unit 104 to the first unit 102—e.g., bi-directional differential signaling can be supported with bi-directional differential connection interfaces. In other words, although the first differential connection interface 112 is illustrated without a receiver, the first differential connection interface 112 can also include a receiver. Similarly, although the second differential connection interface 114 is illustrated without a driver, the second differential connection interface 114 can also include a driver. In such cases, a driver of the second differential connection interface 114 can drive a differential signal, such as the differential signal 110, from the second unit 104 to the first unit 102 over a different or the same differential interconnect 108. Further, at the first unit 102, a receiver of the first differential connection interface 112 can receive the differential signal 110 via the differential interconnect 108. To support differential signaling, the differential interconnect 108 includes a plus pathway and a minus pathway, which are described with reference to FIG. 2.

Figure 2:
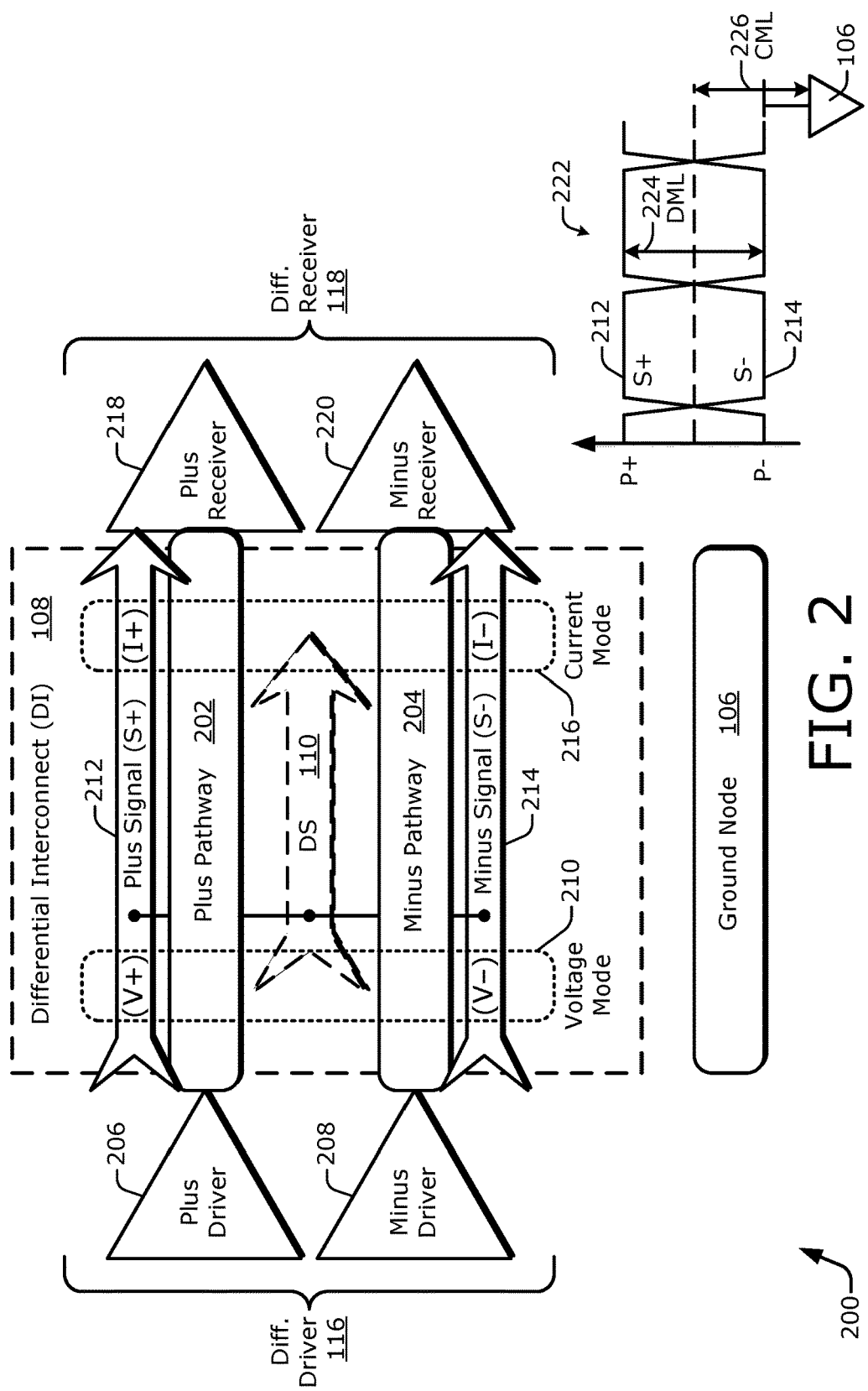
FIG. 2 illustrates an example differential interconnect including a plus pathway and a minus pathway extending between a differential driver and a differential receiver.

FIG. 2 illustrates generally at 200 an example differential interconnect 108 including a plus pathway 202 and a minus pathway 204 that extend between the differential driver 116 and the differential receiver 118. FIG. 2 also includes a graph 222 depicting signal waveforms for a differential-signaling environment. As shown coupled to the differential interconnect 108, the differential driver 116 includes a plus driver 206 and a minus driver 208, and the differential receiver 118 includes a plus receiver 218 and a minus receiver 220. The plus pathway 202 couples the plus driver 206 with the plus receiver 218. The minus pathway 204 couples the minus driver 208 with the minus receiver 220.

The differential signal 110 (DS) includes a plus signal 212 (S+) and a minus signal 214 (S−). The plus signal 212 propagates along the plus pathway 202, and the minus signal 214 propagates along the minus pathway 204. In operation, the plus driver 206 drives the plus signal 212 onto the plus pathway 202, and the plus receiver 218 receives the plus signal 212 via the plus pathway 202. The minus driver 208 drives the minus signal 214 onto the minus pathway 204, and the minus receiver 220 receives the minus signal 214 via the minus pathway 204.

A differential system can be operated in, for example, a voltage mode 210 or a current mode 216. In the voltage mode 210, information is encoded into the differential signal 110 using voltage levels. A plus voltage (V+) is carried by the plus pathway 202 as part of the plus signal 212. A minus voltage (V−) is carried by the minus pathway 204 as part of the minus signal 214. In the current mode 216, information is encoded into the differential signal 110 using current levels. A plus current (I+) is carried by the plus pathway 202 as part of the plus signal 212. A minus current (I−) is carried by the minus pathway 204 as part of the minus signal 214.

In example implementations, the information in the differential signal 110 is encoded based on the plus signal 212 relative to the minus signal 214 using an electrical parameter, such as a voltage level or a current level. With single-ended signaling, information is encoded using an electrical parameter on one pathway relative to a ground. In contrast, with double-ended or differential signaling, information is encoded using an electrical parameter on two different pathways—the plus pathway 202 and the minus pathway 204. With differential signaling, the plus signal 212 and the minus signal 214 can be implemented as complementary signals in which one has a high electrical parameter level when the other has a low electrical parameter level, and vice versa.

In other words, the information is encoded using a plus electrical parameter (P+) relative to a minus electrical parameter (P−). The graph 222 depicts an example of differential signaling using signal waveforms. The plus signal 212 (S+) and the minus signal 214 (S−) are encoded into the plus electrical parameter (P+) and the minus electrical parameter (P−). Thus, the information of the differential signal 110 is encoded based on the value of the plus electrical parameter (P+) and the value of the minus electrical parameter (P−). For example, the information can be encoded based on a difference between a level of the plus electrical parameter (P+) and a level of the minus electrical parameter (P−).

In the graph 222, a differential mode level 224 (DML) (e.g., a differential mode voltage (DMV) or differential mode current (DMI)) is depicted as a difference between the plus electrical parameter (P+) and the minus electrical parameter (P−). A common mode level 226 (CIVIL), on the other hand, is depicted relative to the ground node 106. Specifically, the common mode level 226 is based on: (1) a midpoint between the plus electrical parameter (P+) and the minus electrical parameter (P−) and (2) an equipotential of the ground node 106.

Referring again to the differential interconnect 108, the plus receiver 218 receives the plus signal 212 (S+), and the minus receiver 220 receives the minus signal 214 (S−). To decode the information of the differential signal 110, the differential receiver 118 is implemented as, for example a differential amplifier. The information (e.g., a logical or digital "0" or "1," a rising edge or falling edge of a pulse, a current charge or the absence of a current charge) is recovered by determining a difference between the plus electrical parameter (P+) and the minus electrical parameter (P−), or vice versa. In other words, the encoded information is based on if the plus signal 212 has the plus electrical parameter (P+) and the minus signal 214 has the minus electrical parameter (P−), or if the plus signal 212 has the minus electrical parameter (P−) and the minus signal 214 has the plus electrical parameter (P+). In this manner, the plus signal 212 propagating on the plus pathway 202 and the minus signal 214 propagating on the minus pathway 204 jointly carry information that is determinable relative to each other (e.g., based on the electrical parameters contemporaneously taken by each other). The plus signal 212 propagating on the plus pathway 202 and the minus signal 214 propagating on the minus pathway 204 therefore carry information that is determinable separately from, such as independently of, the ground node 106.

Figure 3:
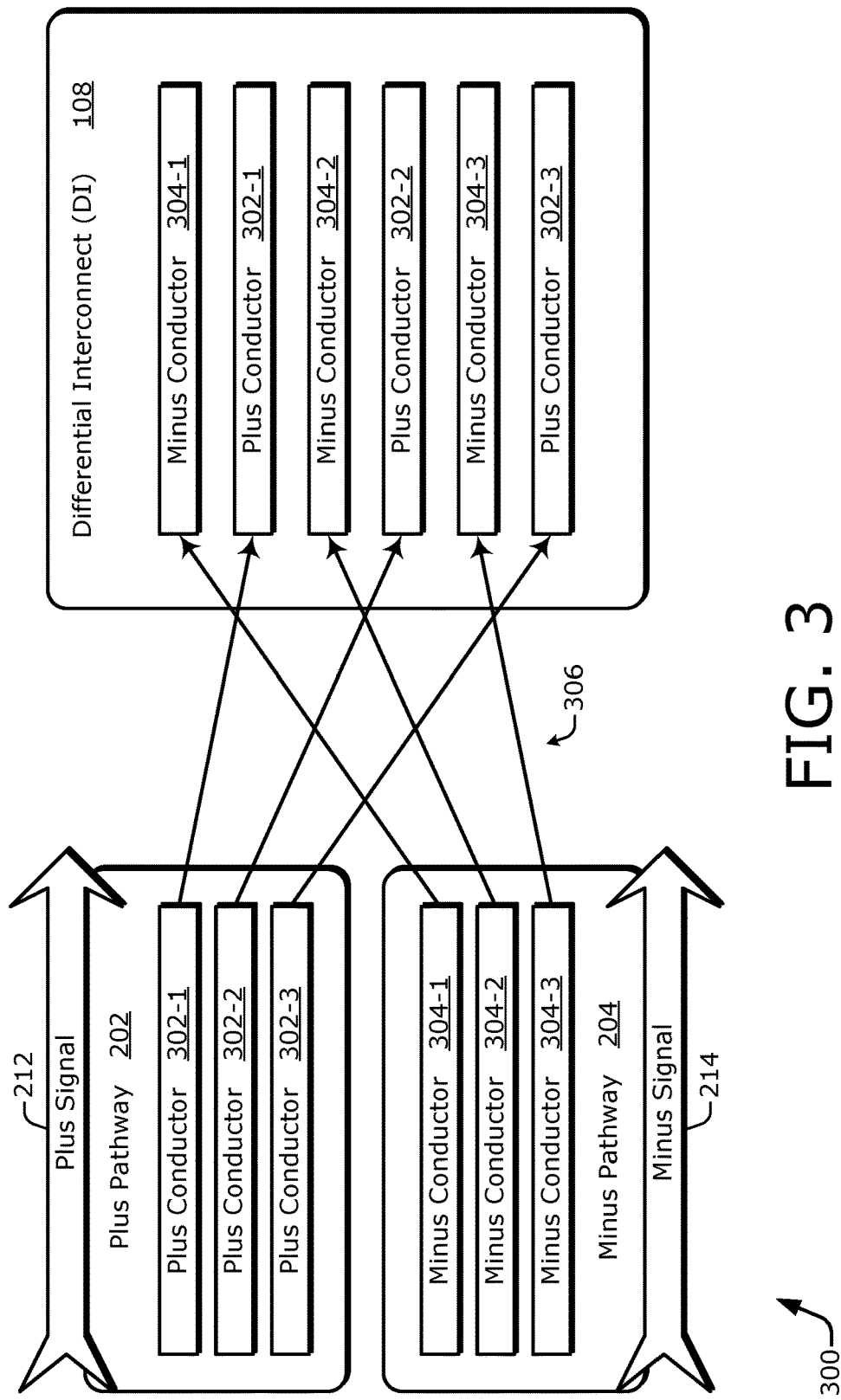
FIG. 3 illustrates an example scheme for a differential interconnect including a plus pathway that is distributed across multiple plus conductors and a minus pathway that is distributed across multiple minus conductors, wherein individual plus conductors and individual minus conductors are jointly disposed in an interleaved arrangement.

FIG. 3 illustrates an example scheme 300 for a differential interconnect 108 that includes a plus pathway 202 and a minus pathway 204. The plus pathway 202 carries the plus signal 212, and the minus pathway 204 carries the minus signal 214. In the example scheme 300, the differential interconnect 108 is realized as a distributed differential interconnect. In some example implementations, the plus pathway 202 is distributed across multiple plus conductors, and the minus pathway 204 is distributed across multiple minus conductors. In FIG. 3, the left side depicts an example of a logical representation of the plus pathway 202 and the minus pathway 204 with distributed conductors, and the right side depicts an example of a physical representation of these two pathways with distributed and interleaved conductors. As shown on the left, the plus pathway 202 is distributed across multiple plus conductors 302-1, 302-2, and 302-3. Similarly, the minus pathway 204 is distributed across multiple minus conductors 304-1, 304-2, and 304-3. Thus, the plus signal 212 propagates over the multiple plus conductors 302-1, 302-2, and 302-3. And the minus signal 214 propagates over the multiple minus conductors 304-1, 304-2, and 304-3.

In some example implementations, as shown on the right, the multiple plus conductors 302-1, 302-2, and 302-3 and the multiple minus conductors 304-1, 304-2, and 304-3 are deployed in an interleaved arrangement to form the differential interconnect 108. In other words, individual plus conductors of the multiple plus conductors 302-1, 302-2, and 302-3 are disposed in an interleaved arrangement with individual minus conductors of the multiple minus conductors 304-1, 304-2, and 304-3. For example, one plus conductor 302 is disposed on one side of and adjacent to a minus conductor 304, which is disposed adjacent to another plus conductor 302 on another side of the minus conductor 304. A given conductor type or polarity—plus or minus—is bordered on both sides by a complementary conductor polarity, except for the two outer-most or externally-disposed conductors. Arrows 306 indicate placements for an example interleaved order from top to bottom: the minus conductor 304-1, the plus conductor 302-1, the minus conductor 304-2, the plus conductor 302-2, the minus conductor 304-3, and the plus conductor 302-3.

Each conductor can be realized, for example, as a metal trace on a printed circuit board or as a metal line (e.g., a wire) in a metal layer of an integrated circuit. However, conductors can also be realized in other manners. Although each pathway is distributed across three conductors in FIG. 3 for a total of six conductors for the differential interconnect 108, each pathway may alternatively be distributed across fewer (e.g., two) conductors or more (e.g., 4, 5, 6, 10, or 16) conductors. Also, the number of conductors for the plus pathway 202 may differ from the number of conductors for the minus pathway 204.

In operation, the multiple minus conductors 304-1, 304-2, and 304-3 jointly carry the minus signal 214 to realize the minus pathway 204. The multiple plus conductors 302-1, 302-2, and 302-3 jointly carry the plus signal 212 to realize the plus pathway 202. The multiple plus conductors and the multiple minus conductors forming a distributed differential interconnect 108 are coupled to plus and minus drivers and receivers to propagate a differential signal as described with reference to FIG. 4.

Figure 4:
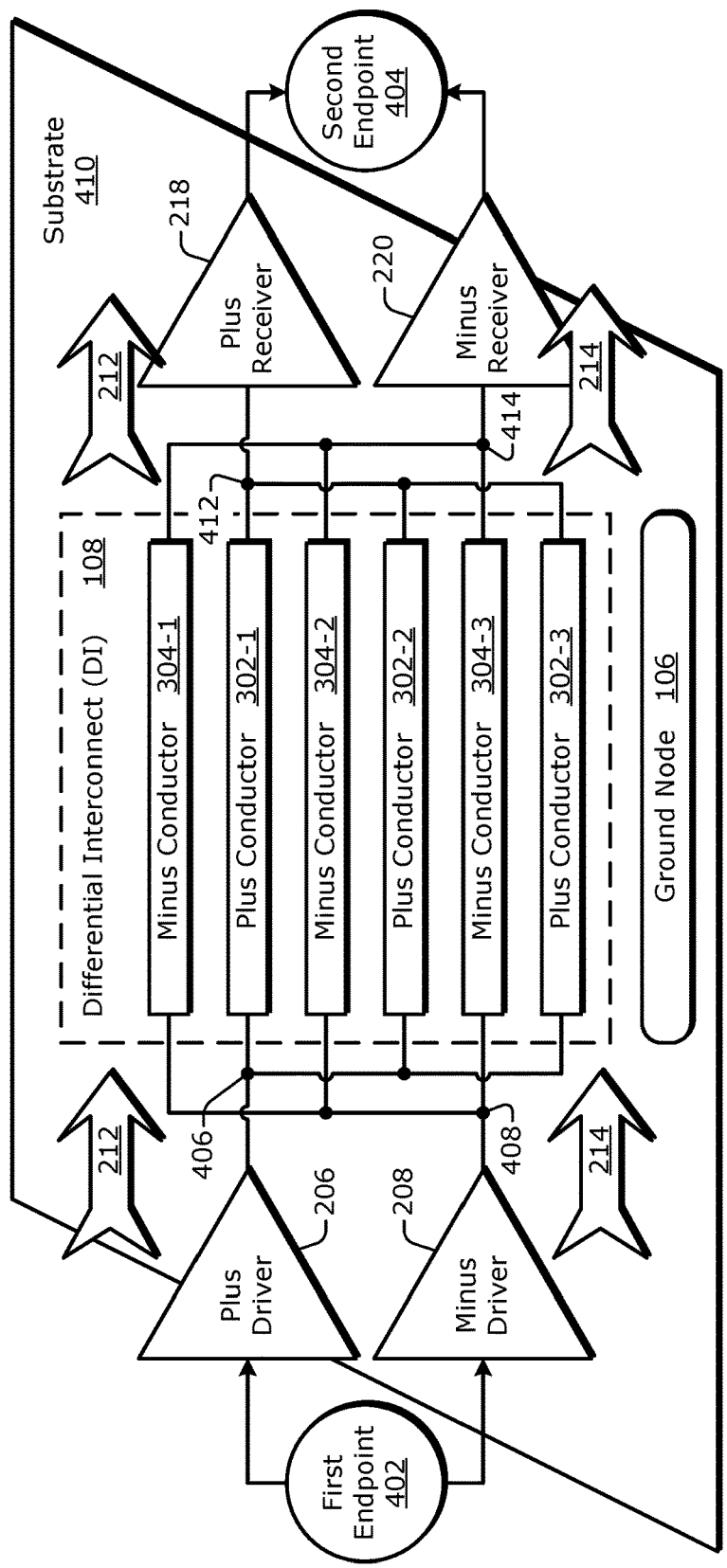
FIG. 4 illustrates example circuitry for coupling the interleaved arrangement of a differential interconnect to a first endpoint and a second endpoint.

FIG. 4 illustrates example circuitry 400 for coupling an interleaved arrangement of a differential interconnect 108 to a first endpoint 402 and a second endpoint 404. At least part of the circuitry 400 is disposed on a substrate 410, such as that of an integrated circuit or a printed circuit board. The differential interconnect 108 includes multiple minus conductors 304-1, 304-2, and 304-3 and multiple plus conductors 302-1, 302-2, and 302-3. The minus conductors and the plus conductors are deployed in an interleaved arrangement as described with reference to FIG. 3.

The circuitry 400 includes a plus input node 406, a minus input node 408, a plus output node 412, and a minus output node 414. The circuitry 400 also includes a first endpoint 402 and a second endpoint 404. Although not explicitly so depicted in FIG. 4, the first endpoint 402 or the second endpoint 404 may be disposed on the substrate 410. Example implementations for the first endpoint 402 include the first unit 102, the first differential connection interface 112, the differential driver 116 (each of FIG. 1), nodal connections thereof, or the plus input node 406 and the minus input node 408. Thus, the plus driver 206 or the minus driver 208 may be incorporated as at least part of the first endpoint 402. Example implementations for the second endpoint 404 include the second unit 104, the second differential connection interface 114, the differential receiver 118 (each of FIG. 1), nodal connections thereof, or the plus output node 412 and the minus output node 414. Thus, the plus receiver 218 or the minus receiver 220 may be incorporated as at least part of the second endpoint 404.

As illustrated, the first endpoint 402 is coupled to an input of the plus driver 206 and an input of the minus driver 208. An output of the plus driver 206 is coupled to the plus input node 406. The plus input node 406 is coupled to an input side of each of the multiple plus conductors 302-1, 302-2, and 302-3. An output side of each of the multiple plus conductors 302-1, 302-2, and 302-3 is coupled to the plus output node 412. The plus output node 412 is coupled to an input of the plus receiver 218. An output of the minus driver 208 is coupled to the minus input node 408. The minus input node 408 is coupled to an input side of each of the multiple minus conductors 304-1, 304-2, and 304-3. An output side of each of the multiple minus conductors 304-1, 304-2, and 304-3 is coupled to the minus output node 414. The minus output node 414 is coupled to an input of the minus receiver 220. An output of the plus receiver 218 and an output of the minus receiver 220 are coupled to the second endpoint 404.

In operation, the first endpoint 402 encodes information (e.g., a rising edge or a falling edge of a pulse or a binary value) into a differential signal including a plus signal 212 and a minus signal 214. The plus driver 206 drives the plus signal 212 via the plus input node 406 along the multiple plus conductors 302-1, 302-2, and 302-3 to the plus output node 412. From the plus output node 412, the plus receiver 218 receives the plus signal 212 and presents the plus signal 212 at the output of the plus receiver 218. The minus driver 208 drives the minus signal 214 via the minus input node 408 along the multiple minus conductors 304-1, 304-2, and 304-3 to the minus output node 414. From the minus output node 414, the minus receiver 220 receives the minus signal 214 and presents the minus signal 214 at the output of the minus receiver 220. The second endpoint 404 obtains the plus signal 212 and the minus signal 214 from the output of the plus receiver 218 and the output of the minus receiver 220, respectively. The second endpoint 404 decodes the plus signal 212 and the minus signal 214 to reconstitute the information.

As described herein, the differential interconnect 108 can be implemented using a plus pathway 202 (e.g., of FIGS. 2 and 3) that is distributed over multiple plus conductors and a minus pathway 204 that is distributed over multiple minus conductors. Further, the multiple plus conductors and the multiple minus conductors can be disposed in an interleaved arrangement that alternates minus and plus conductors across a total width of the differential interconnect. This interleaved scheme results in a distributed differential interconnect that reduces both a differential inductance and an inductive coupling possessed or generated by the distributed differential interconnect as compared to a conventional differential approach that employs a single plus conductor for a plus pathway and a single minus conductor for a minus pathway. Physical properties and physics principles that explain the reduction in the differential inductance and the inductive coupling are described with reference to FIGS. 5-8.

Figure 5:
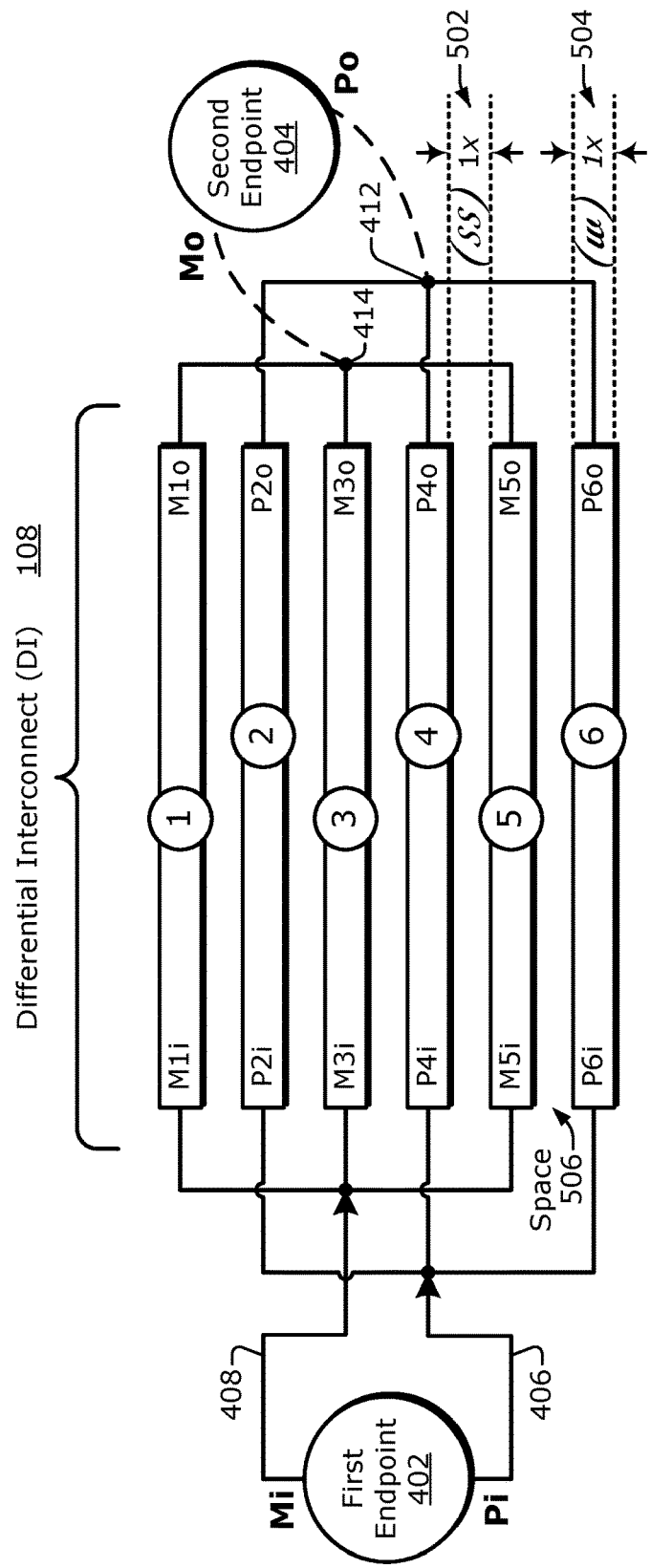
FIG. 5 depicts an example interleaved arrangement for a differential interconnect in conjunction with first and second endpoints and certain physical layout parameters.

FIG. 5 depicts an example interleaved arrangement 500 for a differential interconnect 108 in conjunction with a first endpoint 402 and a second endpoint 404 as well as certain physical parameters. To facilitate an explanation of the differential inductance of the differential interconnect 108, plus conductors are indicated with a "P" indicator, and minus conductors are indicated with an "M" indicator. Each conductor is also marked with an "i" letter representative of an input side and an "o" letter representative of an output side. Further, the conductors are numbered sequentially from 1 to 6.

Thus, a first conductor (1) is a minus conductor having a minus polarity with an "M1$i$" designation and an "M1$o$" designation. A second conductor (2) is a plus conductor having a plus polarity with a "P2$i$" designation and a "P2$o$" designation. A third conductor (3) is a minus conductor having the minus polarity with an "M3$i$" designation and an "M3$o$" designation. A fourth conductor (4) is a plus conductor having the plus polarity with a "P4$i$" designation and a "P4$o$" designation. A fifth conductor (5) is a minus conductor having the minus polarity with an "M5$i$" designation and an "M5$o$" designation. A sixth conductor (6) is a plus conductor having the plus polarity with a "P6$i$" designation and a "P6$o$" designation.

The first conductor (1) and the second conductor (2) form a first pair of conductors, and the second conductor (2) and the third conductor (3) form a second pair of conductors. The third conductor (3) and the fourth conductor (4) form a third pair of conductors. Also, the fourth conductor (4) and the fifth conductor (5) form a fourth pair of conductors, and the fifth conductor (5) and the sixth conductor (6) form a fifth pair of conductors. The first pair of conductors, the second pair of conductors, the third pair of conductors, the fourth pair of conductors, and the fifth pair of conductors each define an intervening space, or space 506.

The first endpoint 402 generates a minus input (Mi) and a plus input (Pi). The first endpoint 402 provides the minus input (Mi) at the minus input node 408 to the first (1), third (3), and fifth (5) minus conductors using, for example, a minus driver 208 (not shown in FIG. 5). The first endpoint 402 provides the plus input (Pi) at the plus input node 406 to the second (2), fourth (4), and sixth (6) plus conductors using, for example, a plus driver 206 (not shown in FIG. 5). The second endpoint 404 obtains a minus output (Mo) and a plus output (Po). The second endpoint 404 detects the minus output (Mo) at the minus output node 414 from the first (1), third (3), and fifth (5) minus conductors using, for example, a minus receiver 220 (not shown in FIG. 5). The second endpoint 404 detects the plus output (Po) at the plus output node 412 from the second (2), fourth (4), and sixth (6) plus conductors using, for example, a plus receiver 218 (not shown in FIG. 5).

The differential interconnect 108 is disposed in the interleaved arrangement 500 as shown. Additionally or alternatively, the multiple plus conductors and the multiple minus conductors can be disposed in a substantially parallel arrangement. In a substantially parallel arrangement, each conductor is substantially parallel to another conductor. For example, each conductor can be substantially parallel to each other conductor of the differential interconnect 108. As used herein, one conductor is substantially parallel to another conductor if, for instance, the one conductor is designed to lie in one row or column and the other conductor is designed to lie in another row or column, respectively, of a grid layout on an integrated circuit or printed circuit board. In a substantially parallel arrangement, individual plus conductors and individual minus conductors do not make contact with one another along a full length of the differential interconnect 108. The extent to which one conductor is parallel to another conductor may depend on a precision available with a given manufacturing process or semiconductor fabrication technology.

Two conductors may be substantially parallel to each other even if the two conductors include one or more corners where the conductors make a turn (e.g., a 90 degree turn) on a substrate. Further, two conductors may be substantially parallel to each other even if one deviates from the other to extend a length of the one to match a length of the other so as to accommodate a corner (because conductors on the outside of a corner become longer). Similarly, two conductors may be substantially parallel to each other even if an input part or an output part of one or the other has an additional curve or extra length to equalize respective overall lengths of the two conductors.

Each conductor has a width (w) as indicated by an arrow 504. In some example implementations, each conductor has a width (w) that is substantially constant across the multiple plus conductors and the multiple minus conductors of the differential interconnect 108. Different conductors can have a substantially common width (w) (e.g., a same width or equal widths) to a precision level available with a given manufacturing process or semiconductor fabrication technology. For example, conductors formed using a 22 nanometer (nm) process have a common width that can be made more consistently the same as compared to conductors having a common width that are formed using a 90 nm process. Any two adjacent conductors define a space 506 on the substrate along at least a portion of the lengths of the two adjacent conductors. Each space 506 has a spacing size (ss) as indicated by an arrow 502. In some example implementations, each space 506 between pairs of adjacent conductors has a spacing size (ss) that is substantially constant across the differential interconnect 108 (e.g., from the first conductor to the sixth conductor) to establish a substantially parallel arrangement. Pairs of adjacent conductors can have a substantially common spacing size (ss) (e.g., a same spacing size or equal spacing sizes) therebetween to a precision level available with a given manufacturing process or semiconductor fabrication technology.

In some example implementations, the spacing size (ss) of each space 506 is substantially equal to a width (w) of each conductor. The extent to which the spacing size (ss) and the width (w) are equal may depend on a precision available with a given manufacturing or fabrication process technology. For example, sizes or widths may be substantially common or may be substantially equal to one another or the same if one does not deviate from the other by more than 10-25%. As shown in FIG. 5, the spacing size (ss) and the width (w) are both indicated to be "1x." The size of x may depend on a given electronics environment. For example, the size of x can be set to a minimum size (e.g., a minimum size line width) that can be drawn or that is otherwise attainable based on a manufacturing process technology (e.g., with a particular semiconductor manufacturing process or other fabrication technology). By minimizing both the size of a line width (w) and the spacing size (ss), a number of conductors that can be built in a certain total width of, or in a certain overall area that is allocated to, the differential interconnect 108 can be maximized. As described below, increasing the number of conductors can further decrease a differential inductance or an inductive coupling of a differential interconnect 108.

Figure 6:
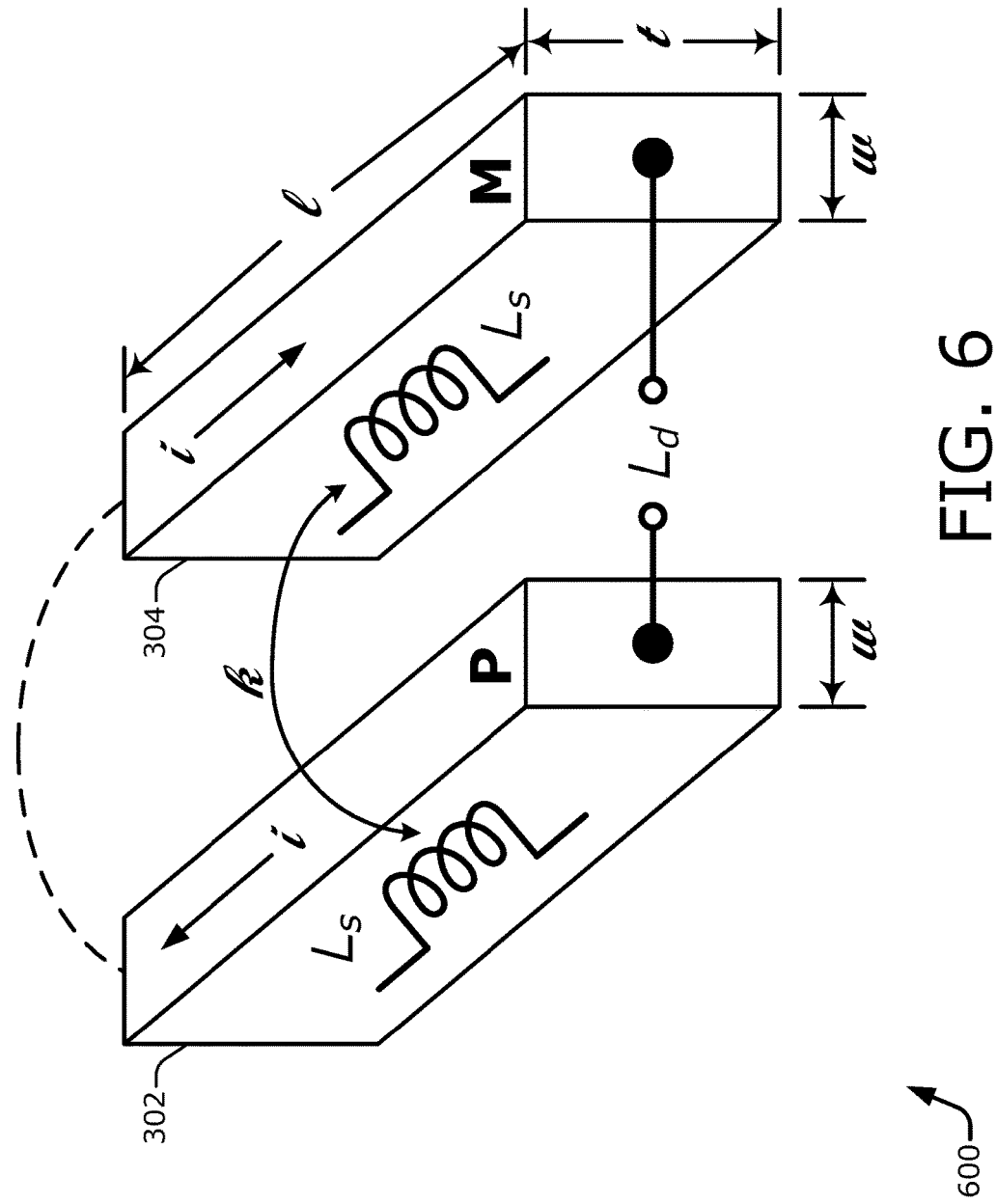
FIG. 6 depicts an example of two parallel conductors, a plus conductor and a minus conductor, with associated physical and electromagnetic parameters.

FIG. 6 depicts generally at 600 an example of two parallel conductors, which include a plus conductor 302 (P) and a minus conductor 304 (M). Associated physical and electromagnetic parameters are also indicated. Each conductor has the following physical measurements: a length (l), a width (w), and a thickness (t). Each conductor also has a self-inductance ($L_s$). As shown, a current (i) is flowing toward the background in the plus conductor 302 (P), and a current (i) is flowing toward the foreground in the minus conductor 304 (M). A coupling coefficient (k) between the P conductor and the M conductor is also shown.

The P conductor and the M conductor jointly have a differential inductance ($L_d$). The differential inductance ($L_d$) seen looking into the P and M conductances that are carrying equal current (i) in opposite directions is given by:

$$L_d = 2L_s - 2M_i = 2L_s(1-k), \quad (1)$$

where $M_i$ is the mutual inductance between the P and M conductors, and $M_i = kL_s$. From Equation (1), it is apparent that the differential inductance ($L_d$) can be reduced by (1) reducing the self-inductance ($L_s$) of each conductor or (2) increasing the coupling coefficient (k) between the P and M conductors closer to unity. Here, with regard to the differential inductance ($L_d$), the coupling coefficient (k) is applicable to two conductors having opposite polarities (e.g., P/M).

Self-inductance ($L_s$) can be determined for a given conductor as follows. The self-inductance ($L_s$) of a conductor having a length (l) that is substantially greater than the cross-section "txw" (e.g., where the length (l) dominates the physical size parameters) is determinable from:

$$L_S = 2l\left(\log\frac{2l}{R} - 1 + \frac{R}{l}\right) \quad (2)$$

where, $$R = \beta(t+w) = \beta t\left(1 + \frac{w}{t}\right). \quad (3)$$

The factor β is almost or effectively a constant for a wide-range of w/t values. Thus, as is apparent from Equations (2) and (3), the self-inductance ($L_s$) is a logarithmic function of the width (w) of a conductor.

Consequently, increasing the width (w) of a conductor does not significantly change the self-inductance ($L_s$) of the conductor. In one example environment, a conductor having a width of 1x has a self-inductance of 85.44 picohenries (pH), and doubling the width of the conductor to 2x only decreases the self-inductance to 79.03 pH. In the same environment, the self-conductance decreases to 74.8 pH at a width of 3x and to only 59.77 pH at a width of 9x.

However, self-inductance can also be determined in terms of an effective self-inductance ($L_{S,eff}$) of a pair of conductors if multiple conductors are present in a given environment. If two conductors are disposed in parallel, the effective self-inductance ($L_{S,eff}$) of the pair is given by:

$$L_{S,eff} = \frac{1}{2}L_S(1+k). \quad (4)$$

Thus, as is apparent from Equation (4), reducing the coupling coefficient (k) can contribute to reducing the effective self-inductance ($L_{S,eff}$). Here, with regard to the effective self-inductance ($L_{S,eff}$), the coupling coefficient (k) is applicable to two conductors having the same polarity (e.g., P/P or M/M). The coupling coefficient (k) decreases as the spacing size between two conductors increases. In an example environment with two parallel conductors having a width (w) of 1x, the coupling coefficient (k) is 0.771 with a spacing size of 1x between the two conductors, and the coupling coefficient (k) decreases to 0.630 with a spacing size of 3x. In the same environment, a spacing size of 9x causes the coupling coefficient (k) to decrease to 0.439, and a spacing size of 39x results in a coupling coefficient (k) of 0.182.

Continuing with reference to FIGS. 5 and 6, an example approach to reducing differential inductance ($L_d$) is described. To reduce a differential inductance ($L_d$) of a differential interconnect 108, the self-inductance ($L_s$) of each conductor is reduced by reducing the coupling coefficient (k) between conductors having the same polarity (e.g., P/P or M/M). Additionally or alternatively, the differential inductance ($L_d$) of a differential interconnect 108 can be reduced by increasing the coupling coefficient (k) towards unity between conductors having a complementary polarity (e.g., P/M).

In the interleaved arrangement 500, the plus conductor P2 is disposed between the minus conductor M1 and the minus conductor M3. The presence of the plus conductor P2 between the two minus conductors M1 and M3 reduces the coupling coefficient (k13) between the two M conductors, specifically between the minus conductor M1 and the minus conductor M3, by increasing the distance between the two M conductors. This reduction in the coupling coefficient (k) is also applicable to two P conductors that are separated by an M conductor. The interleaved arrangement 500 disposes a conductor of one polarity between two other conductors of an opposite polarity. This arrangement therefore reduces the coupling coefficient (k) between two parallel conductors having the same polarity, which reduces the effective self-inductance ($L_{S,eff}$) of the two parallel conductors.

Also in the interleaved arrangement 500, the plus conductor P2 is placed on one side of the minus conductor M3, and the plus conductor P4 is placed on the other side of the minus conductor M3. This placement increases the effective coupling coefficient (k23+k34) between the conductors having opposite polarities, specifically between the minus conductor M3 and the plus conductors P2 and P4. This reduction in the effective coupling coefficient (k+k) is also applicable to two M conductors that are separated by a P conductor. The interleaved arrangement 500 disposes a conductor of one polarity between two other conductors of an opposite polarity. This arrangement therefore increases the effective coupling coefficient (k+k) between two parallel conductors having complementary polarities.

To compare a conventional differential interconnect with an example distributed implementation of a differential interconnect 108 as described herein, the overall area, or total width, of both differential interconnects is set to be the same. In other words, a distributed differential interconnect having a particular total width is compared to a conventional differential interconnect having the same particular total width. For example, if a distributed differential interconnect has a total width of 7x, the distributed differential interconnect includes four conductors (e.g., two plus conductors interleaved with two minus conductors) and three intervening spaces with each having a width of 1x The comparative conventional differential interconnect with a total width of 7x has a plus conductor with a width of 3x, a minus conductor with a width of 3x, and one intervening space having a width of 1x.

In another example, if a distributed differential interconnect has a total width of 15x, the distributed differential interconnect includes eight conductors (e.g., four plus conductors interleaved with four minus conductors) and seven intervening spaces with each having a width of 1x. The comparative conventional differential interconnect with a total width of 15x has a plus conductor with a width of 7x, a minus conductor with a width of 7x, and one intervening space having a width of 1x. Using these two examples for comparison, for the total width of 7x, the differential inductance ($L_d$) decreases by 28% for the distributed differential interconnect implementation as compared to the conventional differential interconnect. For the total width of 15x, the differential inductance ($L_d$) decreases by 60% for the distributed differential interconnect implementation as compared to the conventional differential interconnect.

This reduction in the differential inductance ($L_d$) does have an associated cost. The conductive portion of the total width of the differential interconnect is decreased with a distributed differential interconnect implementation. Consequently, the resistance of the distributed differential interconnect will typically be increased. However, as the frequency of operation of a circuit increases, such as with 5G or even 4G wireless technologies, this tradeoff becomes worthwhile as the inductive reactance begins to dominate.

Table 1 below provides a comparison of an example distributed differential interconnect implementation relative to a conventional differential interconnect across a range of total widths from 7x to 19x with regard to differential inductance ($L_d$).

TABLE 1

Differential Interconnect Comparison for Differential Inductance ($L_d$).

| Total Width | Distributed Differential Interconnect | | Conventional Differential Interconnect | | Reduction of Differential Inductance ($L_d$) |
|---|---|---|---|---|---|
| | No. of P/M Conductor Pairs | $L_d$ (pH) | Conductor Width | $L_d$ (pH) | |
| 7x | 2 | 32 | 3x | 45 | 28% |
| 11x | 3 | 21 | 5x | 42 | 49% |
| 15x | 4 | 16 | 7x | 40 | 60% |
| 19x | 5 | 13 | 9x | 37 | 65% |

Figure 7:
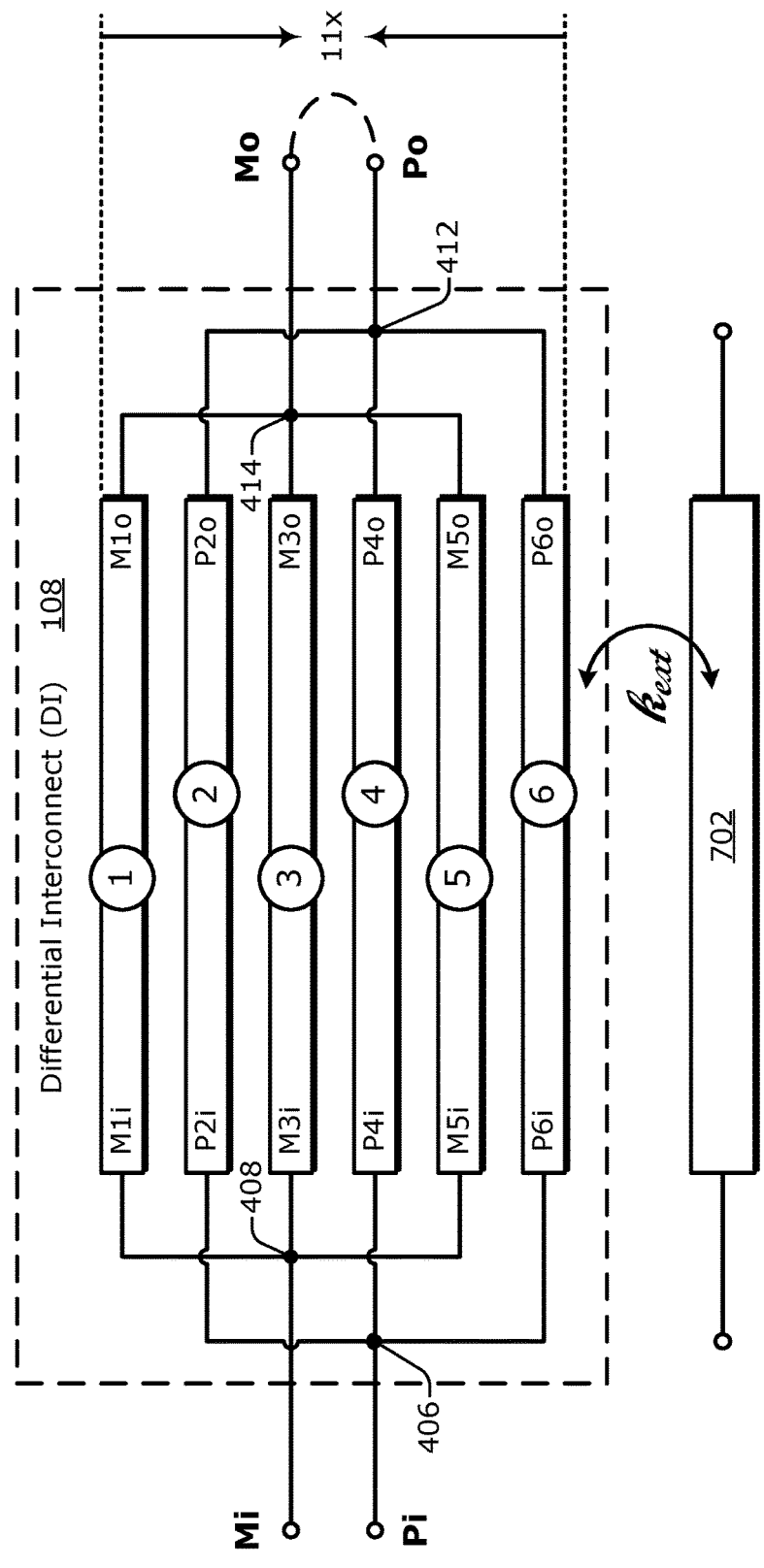
FIG. 7 depicts another example interleaved arrangement for a differential interconnect with regard to an external coupling coefficient that is affected by magnetic flux generated by the multiple conductors.

FIG. 7 depicts generally at 700 another example interleaved arrangement for a differential interconnect 108 with regard to an external coupling coefficient ($k_{ext}$). The external coupling coefficient ($k_{ext}$) is affected by magnetic flux that is generated by the multiple interleaved conductors. Similarly to FIG. 5, six conductors are shown in the interleaved arrangement: a first conductor (M1), a second conductor (P2), a third conductor (M3), a fourth conductor (P4), a fifth conductor (M5), and a sixth conductor (P6). The first, third, and fifth conductors are minus conductors having a minus polarity, and the second, fourth, and sixth conductors are plus conductors having a plus polarity. A minus input (Mi), a plus input (Pi), a minus output (Mo), and a plus output (Po) are also indicated for the differential interconnect 108. As shown, the total width of the differential interconnect 108 with six conductors and five spaces is 11x.

FIG. 7 also includes an external conductor 702 that is disposed external to the differential interconnect 108 and does not carry part of the differential signal (not shown in FIG. 7) propagating along the differential interconnect 108. The external coupling coefficient ($k_{ext}$) represents the coupling coefficient (k) between the differential interconnect 108, as a whole, and the external conductor 702. As is explained below, a distributed differential interconnect implementation can reduce the external coupling coefficient ($k_{ext}$).

Figure 8:
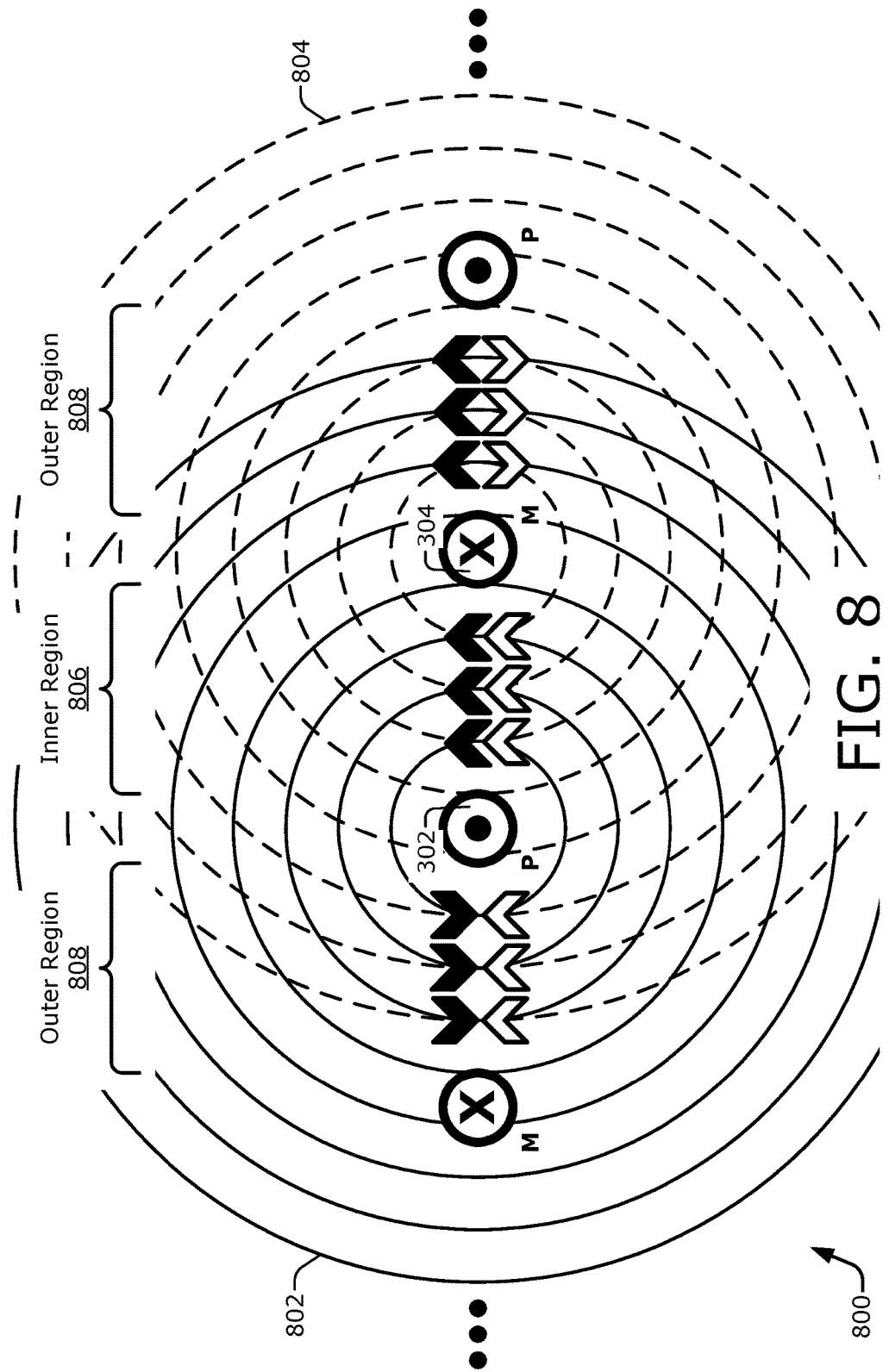
FIG. 8 depicts an example interaction among magnetic flux lines generated by multiple conductors of the differential interconnect of FIG. 7.

FIG. 8 depicts an example interaction 800 among magnetic flux lines generated by multiple conductors of the differential interconnect 108 of FIG. 7 due to currents flowing within the conductors. The example interaction 800 is depicted from a cross-sectional perspective of the differential interconnect 108. A plus conductor 302 (P) is shown with a current that is flowing out of the page as indicated by a dot "•". An adjacent minus conductor 304 (M) is shown with a current that is flowing into the page as indicated by a letter "X". As represented by the ellipses and the other two conductors, the differential interconnect 108 includes additional conductors that generate additional magnetic flux. Thus, the differential interconnect 108 includes multiple adjacent complementary conductors, with each pair of complementary conductors including a plus conductor 302 (P) of the multiple plus conductors and a minus conductor 304 (M) of the multiple minus conductors.

The plus conductor 302 (P) generates a magnetic flux 802 that is represented by solid-lined circles. The magnetic flux 802 is moving in a counter-clockwise direction around the plus conductor 302 (P) as indicated by the solid-filled or black chevrons. The minus conductor 304 (M) generates a magnetic flux 804 that is represented by dashed-lined circles. The magnetic flux 804 is moving in a clockwise direction around the minus conductor 304 (M) as indicated by the unfilled or white chevrons. In an inner region 806 between the plus conductor 302 (P) and the minus conductor 304 (M), the magnetic fluxes 802 and 804 add together as indicated by the black and white chevrons that point in the same direction. On the other hand, in outer regions 808 on the outer edges of the two plus and minus conductors, the magnetic fluxes 802 and 804 substantially cancel each other as indicated by the black and white chevrons that point in opposite directions in both outer regions. Other inner and outer regions for other conductors produce similar magnetic flux augmentations and cancellations along the cross-sectional width of the differential interconnect. In other words, an interleaved distributed differential interconnect generates magnetic flux that is additive in regions between any two adjacent complementary conductors of multiple adjacent complementary conductors and subtractive beyond the regions between any two adjacent complementary conductors. Thus, at points relatively far away from a differential pair of conductors, the magnetic fluxes 802 and 804 combine to produce a negligible resulting magnetic flux. Consequently, the differential pair of conductors have a small coupling coefficient with respect to conductors that are far from the differential pair.

With a distributed differential interconnect, multiple plus and minus conductors form multiple differential pairs (P/M). The differential pairs of the distributed differential interconnect that are disposed farther away from an external conductor, such as the external conductor 702, make a negligible contribution to the external coupling coefficient ($k_{ext}$). Thus, the conductors that are closer to the external conductor 702 primarily contribute to the inductive coupling with the external conductor 702. Because only part of the total current flowing through the differential interconnect 108 flows through the outer-most conductor(s) that are closer to the external conductor 702, the external coupling coefficient ($k_{ext}$) is reduced using a distributed differential interconnect, as compared to a conventional differential approach that has only a single plus conductor and a single minus conductor. By way of comparison, for a total width of 7x, the external coupling coefficient ($k_{ext}$) decreases by 65% for the distributed differential interconnect implementation as compared to the conventional differential interconnect. For a total width of 15x, the external coupling coefficient ($k_{ext}$) decreases by 84% for the distributed differential interconnect implementation as compared to the conventional.

Table 2 below provides a comparison of an example distributed differential interconnect implementation relative to a conventional differential interconnect across a range of total widths from 7x to 15x with regard to an external coupling coefficient ($k_{ext}$).

TABLE 2

Differential Interconnect Comparison for External Coupling Coefficient ($k_{ext}$).

| Total Width | Distributed Differential Interconnect | | Conventional Differential Interconnect | | Reduction of External Coupling Coefficient ($k_{ext}$) |
|---|---|---|---|---|---|
| | No. of P/M Conductor Pairs | $k_{ext}$ | Conductor Width | $k_{ext}$ | |
| 7x | 2 | 0.041 | 3x | 0.116 | 65% |
| 11x | 3 | 0.028 | 5x | 0.126 | 78% |
| 15x | 4 | 0.021 | 7x | 0.129 | 84% |

Figure 9:
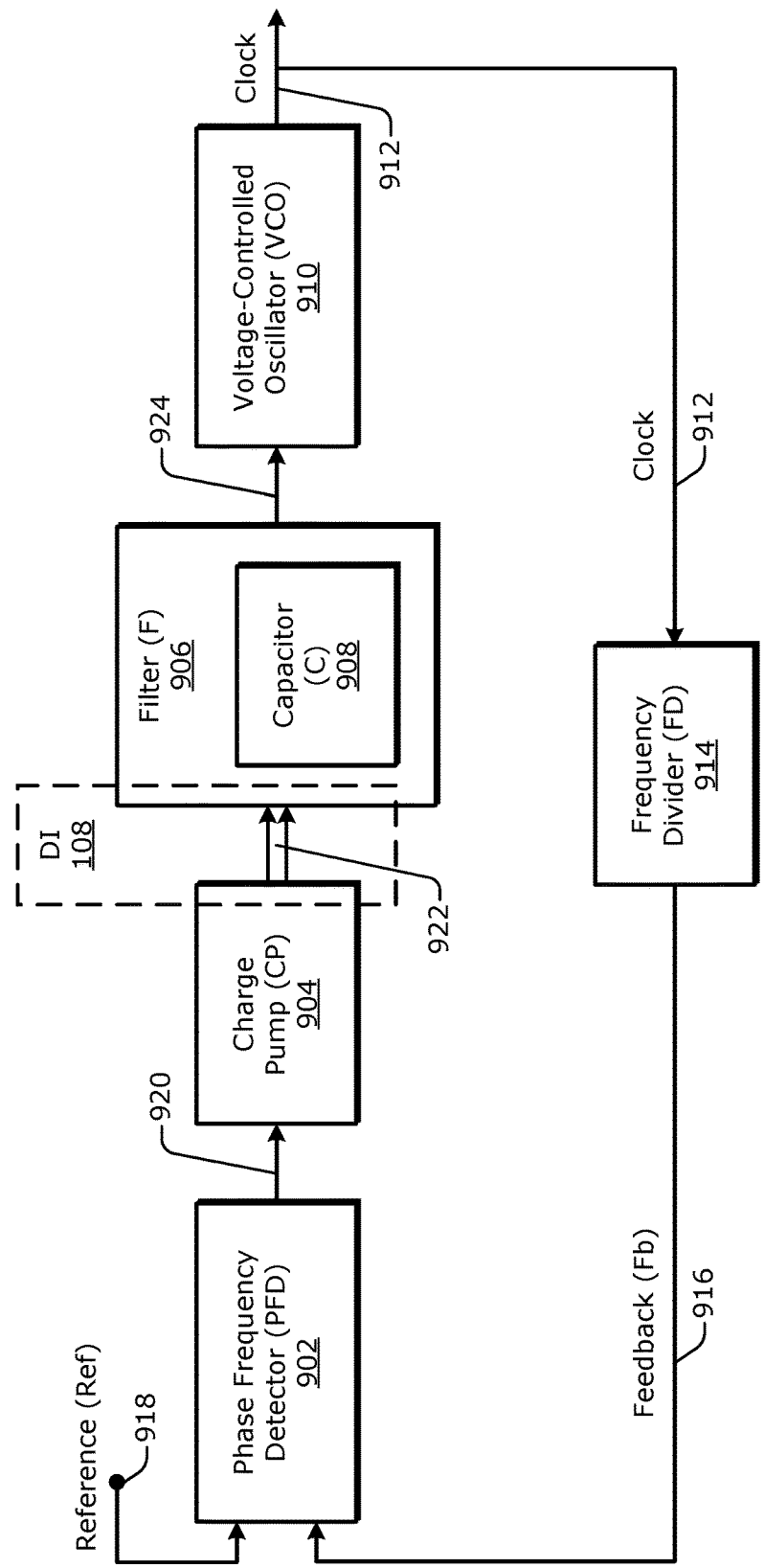
FIG. 9 illustrates an example phase-locked loop (PLL) having a phase frequency detector, a charge pump, and a filter having a capacitor.

FIG. 9 illustrates an example phase-locked loop 900 (PLL) including a phase frequency detector 902 (PFD), a charge pump 904 (CP), and a filter 906 (F) having a capacitor 908 (C). The phase-locked loop 900 also includes a voltage-controlled oscillator 910 (VCO) and a frequency divider 914 (FD). A differential interconnect 108 as described herein can be implemented between the charge pump 904 and the capacitor 908 of the filter 906. An example implementation of the phase-locked loop 900 is briefly described here. An example implementation of the differential interconnect 108 is then described with reference to FIGS. 10-12.

The phase frequency detector 902 receives a reference signal 918 (Ref) and a feedback signal 916 (Fb). Signal flow along the phase-locked loop 900 starts at the phase frequency detector 902 and continues at the charge pump 904. The charge pump 904 provides a signal to the filter 906, and the filter 906 provides a signal to the voltage-controlled oscillator 910. The voltage-controlled oscillator 910 produces a clock signal 912. The clock signal 912 is provided to the frequency divider 914 as part of a feedback loop of the phase-locked loop 900. The frequency divider 914 generates the feedback signal 916 based on the clock signal 912 and a frequency divider value or ratio. The frequency divider 914 also provides the feedback signal 916 to the phase frequency detector 902.

The phase frequency detector 902 produces a digital pulse 920 having a width that is proportional to a phase error between the reference signal 918 and the feedback signal 916. The charge pump 904 receives the digital pulse 920 that is indicative of the phase error and converts the digital pulse 920 to an analog error current 922. The analog error current 922 is propagated from the charge pump 904 over the differential interconnect 108 to the capacitor 908 of the filter 906. The filter 906 uses the capacitor 908 to integrate the analog error current 922 and charge the capacitor 908, and the filter 906 performs a low-pass filtering to generate a control voltage 924. However, in other implementations, a differential interconnect can be used to discharge a capacitor. The control voltage 924 is provided to the voltage-controlled oscillator 910. The voltage-controlled oscillator 910 functions as an oscillator having a frequency that is proportional to the control voltage 924 to produce the clock signal 912. Although not shown, the clock signal 912 that is output by the voltage-controlled oscillator 910 can be amplified by a level shifter to increase the swing of the clock signal 912. Additionally, although not indicated in FIG. 9, a distributed differential interconnect as described herein may be implemented in a return path between the charge pump 904 and the phase frequency detector 902.

Figure 10:
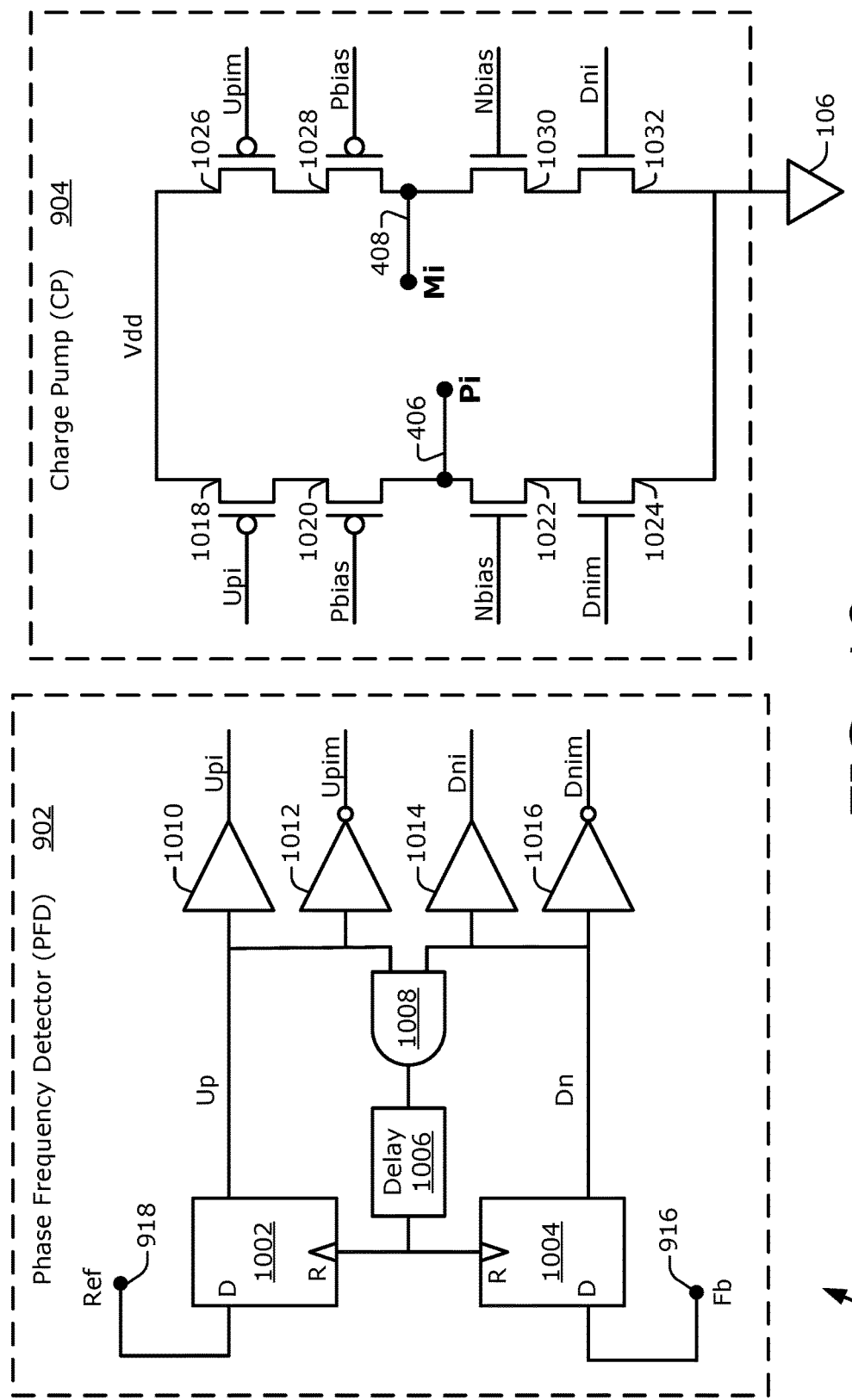
FIG. 10 illustrates an example of circuitry for the phase frequency detector and an example of circuitry for the charge pump.

FIG. 10 illustrates generally at 1000 an example of circuitry for the phase frequency detector 902 and an example of circuitry for the charge pump 904. The phase frequency detector 902 includes two "D" flip-flops, a flip-flop 1002 and a flip-flop 1004; two buffers, a buffer 1010 and a buffer 1014; and two inverters, an inverter 1012 and an inverter 1016. The phase frequency detector 902 also includes an AND gate 1008 and a delay unit 1006.

The reference signal 918 is coupled to an input of the flip-flop 1002. An output of the flip-flop 1002 produces an up signal (Up) that is provided to an input of the buffer 1010 and an input of the inverter 1012. The up signal (Up) is also coupled to a first input of the AND gate 1008. An output of the AND gate 1008 is coupled to an input of the delay unit 1006. An output of the delay unit 1006 is provided to a reset terminal (R) of the flip-flop 1002.

The feedback signal 916 is coupled to an input of the flip-flop 1004. An output of the flip-flop 1004 produces a down signal (Dn) that is provided to an input of the buffer 1014 and an input of the inverter 1016. The down signal (Dn) is also coupled to a second input of the AND gate 1008. As described above, the output of the AND gate 1008 is coupled to the input of the delay unit 1006. The output of the delay unit 1006 is also provided to a reset terminal (R) of the flip-flop 1004.

In operation, the buffer 1010 forwards an up input signal (Upi) at an output thereof based on the up signal (Up). The inverter 1012 inverts the up signal (Up) to produce an up minus input signal (Upim) at an output of the inverter 1012. Based on the down signal (Dn), the buffer 1014 forwards a down input signal (Dni) at an output thereof. The inverter 1016 inverts the down signal (Dn) to produce a down minus input signal (Dnim) at an output of the inverter 1016.

When the reference signal 918 and the feedback signal 916 are both high, both the up signal (Up) and the down signal (Dn) are also high. This causes the AND gate 1008 to output a high signal, which triggers the delay unit 1006. After expiration of a delay period of the delay unit 1006, the delay unit 1006 outputs a reset signal to the reset terminals of the flip-flop 1002 and the flip-flop 1004. Responsive to a rising edge of the reset signal at the reset terminals, the flip-flop 1002 changes the up signal (Up) to a low value, and the flip-flop 1004 changes the down signal (Dn) to a low value. Operation of the phase frequency detector 902 with respect to associated signals is described below with reference to the waveforms depicted in FIG. 11.

The charge pump 904 includes eight transistors. As shown, each transistor is implemented as a field effect transistor (FET). However, other transistor types may alternatively be utilized. The eight transistors include: a PFET 1018, a PFET 1020, a PFET 1026, a PFET 1028, an NFET 1022, an NFET 1024, an NFET 1030, and an NFET 1032. A first set of four transistors are coupled in series from a supply voltage (Vdd) to a ground node 106 in the following order: the PFET 1018, the PFET 1020, the NFET 1022, and the NFET 1024. In parallel with the first set of four transistors, a second set of four transistors are coupled in series from the supply voltage (Vdd) to the ground node 106 in the following order: the PFET 1026, the PFET 1028, the NFET 1030, and the NFET 1032.

A gate terminal of the PFET 1018 receives the up input signal (Upi), and a gate terminal of the PFET 1026 receives the up minus input signal (Upim). A gate terminal of the NFET 1024 receives the down minus input signal (Dnim), and a gate terminal of the NFET 1032 receives the down input signal (Dni). Gate terminals of the PFET 1020 and the PFET 1028 both receive a positive bias signal (Pbias). The positive bias signal (Pbias) is asserted (e.g., driven low) to turn on the PFET 1020 and the PFET 1028 during normal operation of the charge pump 904. Gate terminals of the NFET 1022 and the NFET 1030 both receive a negative bias signal (Nbias). The negative bias signal (Nbias) is also asserted (e.g., driven high) to turn on the NFET 1022 and the NFET 1030 during normal operation of the charge pump 904.

Figure 12:
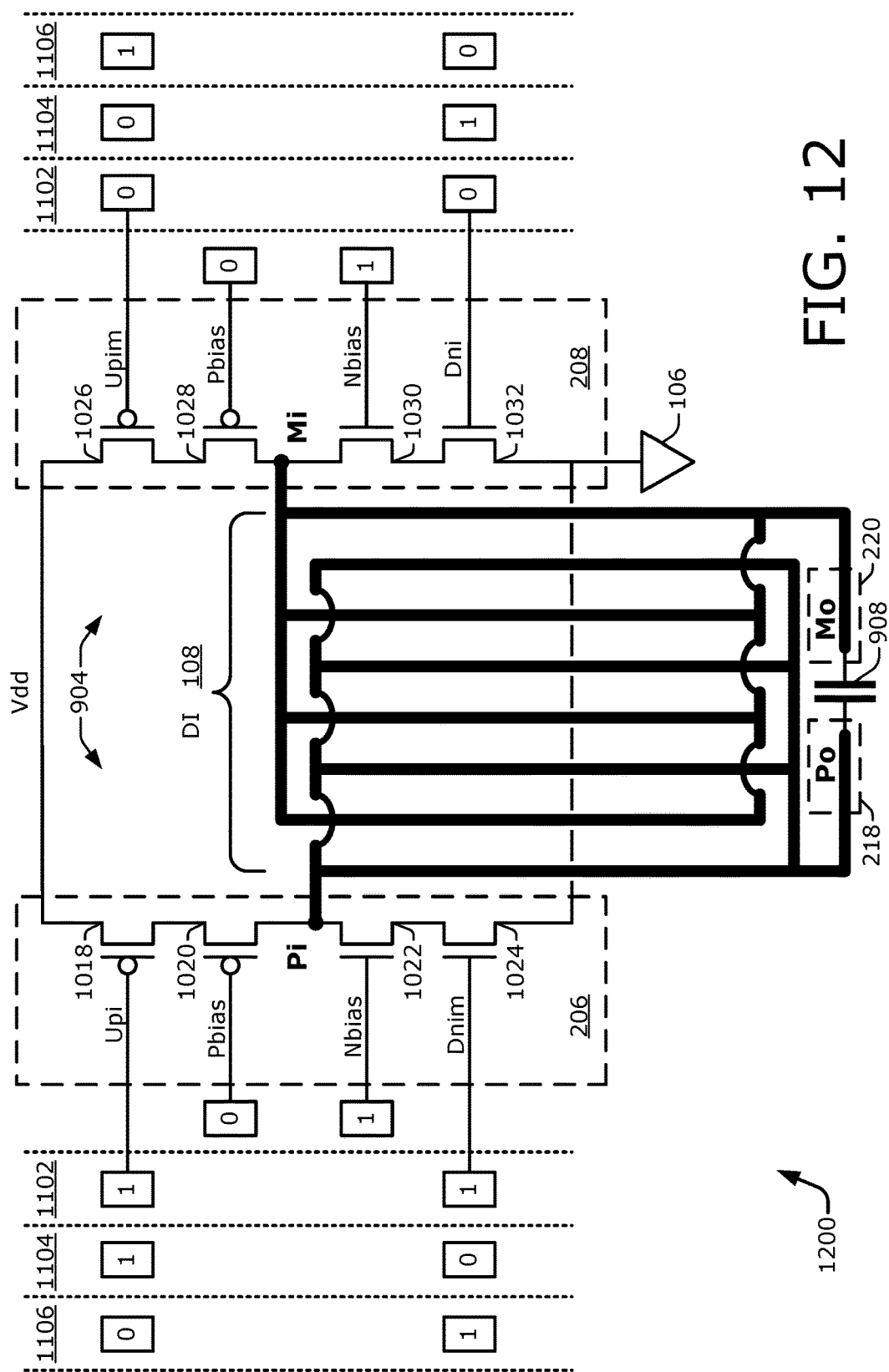
FIG. 12 illustrates the example circuitry for the charge pump as coupled to the capacitor of the filter via a differential interconnect having distributed conductors.

A plus input node 406 to provide a plus input (Pi) to a differential interconnect 108 is located between the two PFETs and the two NFETs of the first set of four transistors (e.g., between the PFET 1020 and the NFET 1022). A minus input node 408 to provide a minus input (Mi) to the differential interconnect 108 is located between the two PFETs and the two NFETs of the second set of four transistors (e.g., between the PFET 1028 and the NFET 1030). A location of the differential interconnect 108 is indicated if FIG. 9, and an example of the differential interconnect 108 is shown in FIG. 12.

Figure 11:
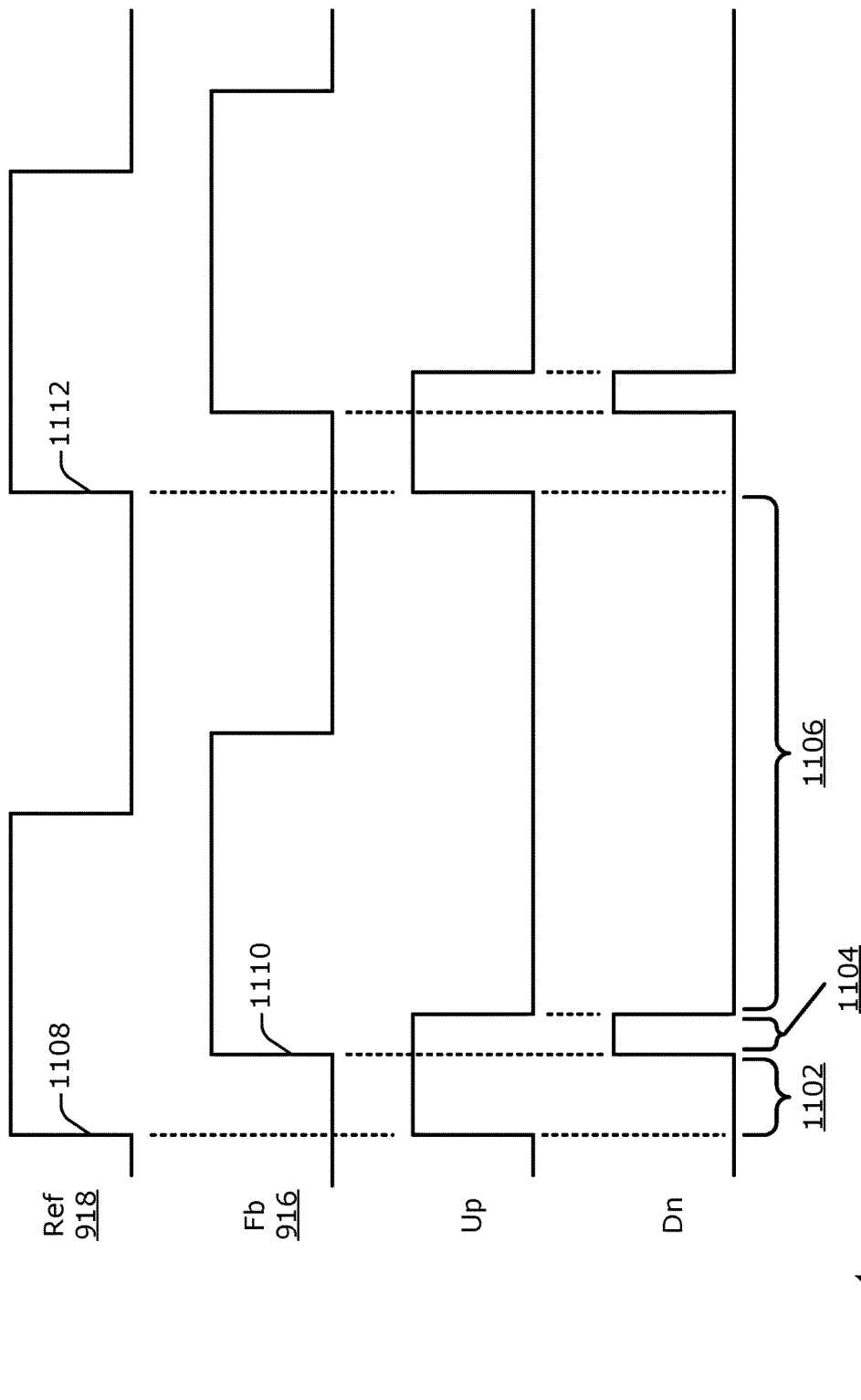
FIG. 11 depicts a signal timing diagram illustrating example signals for the circuitry of the phase frequency detector.

FIG. 11 depicts a signal timing diagram 1100 illustrating example signals for the circuitry of the phase frequency detector 902. The signal timing diagram 1100 includes the reference signal 918, the feedback signal 916, the up signal (Up), and the down signal (Dn). The signal timing diagram 1100 also includes three time periods: a time period 1102, a time period 1104, and a time period 1106. The reference signal 918 has repeating pulses. The feedback signal 916 also has repeating pulses, but the repeating pulses of the feedback signal 916 trail in time or phase as compared to the reference signal 918. The signal waveforms and the time periods of the signal timing diagram 1100 are not necessarily depicted to scale.

With reference to FIGS. 10 and 11, signals for the time period 1102 as well as operation of the phase frequency detector 902 are described. Responsive to a rising edge 1108 of a pulse of the reference signal 918, the flip-flop 1002 is triggered. The triggered flip-flop 1002 causes the up signal (Up) to likewise go high. This is shown in the time period 1102 for the up signal (Up). During the time period 1102, the down signal (Dn) remains low, but the first input of the AND gate 1008 goes high based on the up signal (Up). At the end of the time period 1102, a pulse of the trailing feedback signal 916 arrives.

Signals and operation of the phase frequency detector 902 are now described for the time period 1104. Responsive to a rising edge 1110 of the pulse of the feedback signal 916, the flip-flop 1004 is triggered. The triggered flip-flop 1004 causes the down signal (Dn) to likewise go high. This is shown in the time period 1104 for the down signal (Dn). During the time period 1104, the up signal (Up) remains high. Further, the second input of the AND gate 1008 goes high based on the down signal (Dn). With both inputs of the AND gate 1008 high, the output of the AND gate 1008 becomes high to trigger the delay unit 1006. After expiration of a delay period, the delay unit 1006 outputs a reset signal to trigger the reset terminals of the flip-flop 1002 and the flip-flop 1004. Thus, the delay period of the delay unit 1006 controls the temporal length of the time period 1104.

At the start of the time period 1106, the flip-flop 1002 responds to the asserted reset signal at the reset terminal thereof by driving the up signal (Up) low as shown. Similarly, the flip-flop 1004 responds to the asserted reset signal at the reset terminal thereof by driving the down signal (Dn) low. The time period 1106 continues with the up signal (Up) and the down signal (Dn) in this low condition until another rising edge 1112 of a pulse of the reference signal 918 arrives at the flip-flop 1002.

Thus, during the time period 1102, the up signal (Up) is high, and the down signal (Dn) is low. During the time period 1104, the up signal (Up) is high, and the down signal (Dn) is also high. During the time period 1106, both the up signal (Up) and the down signal (Dn) are low. For any given time period, the up input signal (Upi) takes the value of the up signal (Up) due to the buffer 1010, and the down input signal (Dni) takes the value of the down signal (Dn) due to the buffer 1014. Additionally, the inverter 1012 inverts the up signal (Up) so that the up minus input signal (Upim) takes on an inverted version of the value of the up signal (Up). Similarly, the inverter 1016 inverts the down signal (Dn) so that the down minus input signal (Dnim) takes on an inverted version of the value of the down signal (Dn).

FIG. 12 illustrates generally at 1200 the example circuitry for the charge pump 904 coupled to the capacitor 908 of the filter 906 (of FIG. 9). The coupling is accomplished via a differential interconnect 108 having distributed pathways. In this example, the plus pathway is distributed across four plus conductors, and the minus pathway is distributed across four minus conductors. The differential interconnect 108 is coupled to the charge pump 904 at the plus input (Pi) and the minus input (Mi). The differential interconnect 108 is coupled to the capacitor 908 at the plus output (Po) and the minus output (Mo).

Example implementations of the plus driver 206, the minus driver 208, the plus receiver 218, and the minus receiver 220 are indicated in FIG. 12. The plus driver 206 corresponds to the PFET 1018, the PFET 1020, the NFET 1022, and the NFET 1024. The minus driver 208 corresponds to the PFET 1026, the PFET 1028, the NFET 1030, and the NFET 1032. The plus receiver 218 corresponds to one node for the capacitor 908, and the minus receiver 220 corresponds to another node for the capacitor 908.

An example operation is now described in terms of the time periods 1102, 1104, and 1106 of FIG. 11. During each of the time periods, the positive bias signal (Pbias) is held at a low voltage level as represented by "0" and is provided to the gate terminals of the PFETs 1020 and 1028 as shown. Analogously, during each of the time periods, the negative bias signal (Nbias) is held at a high voltage level as represented by "1" and is provided to the gate terminals of the NFETs 1022 and 1030 as shown.

During the time period 1102, the up input signal (Upi) is a "1," and the up minus input signal (Upim) is a "0." Also, the down input signal (Dni) is a "0," and the down minus input signal (Dnim) is a "1." As a result, during the time period 1102, the PFET 1018 and the NFET 1032 are both turned off. The PFET 1026 and the NFET 1024, however, are both turned on. Consequently, current flows into the differential interconnect 108 via the minus input node (Mi) and out of the differential interconnect 108 via the plus input node (Pi) toward the ground node 106.

During the time period 1104, the up input signal (Upi) is a "1," and the up minus input signal (Upim) is a "0." Also, the down input signal (Dni) is a "1," and the down minus input signal (Dnim) is a "0." As a result, during the time period 1104, the PFET 1018 and the NFET 1024 are both turned off. The PFET 1026 and the NFET 1032, on the other hand, are both turned on. Consequently, no current flows through the differential interconnect 108 during the time period 1104.

During the time period 1106, the up input signal (Upi) is a "0," and the up minus input signal (Upim) is a "1." Also, the down input signal (Dni) is a "0," and the down minus input signal (Dnim) is a "1." As a result, during the time period 1106, the PFET 1026 and the NFET 1032 are both turned off. The PFET 1018 and the NFET 1024, on the other hand, are both turned on. Consequently, no current flows through the differential interconnect 108 during the time period 1106.

Figure 13:
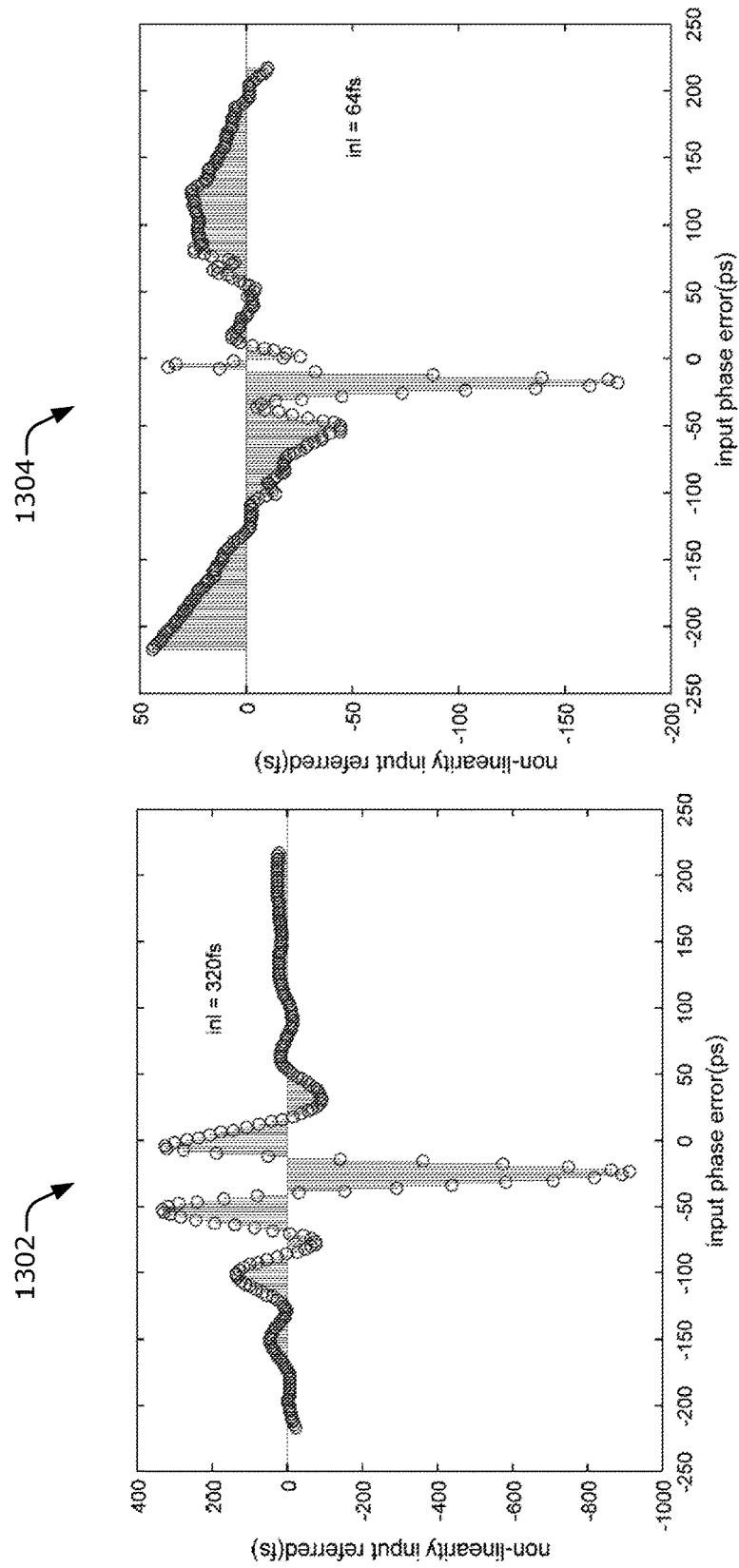
FIG. 13 depicts two graphs contrasting a non-linearity of a conventional differential interconnect with a non-linearity of a distributed differential interconnect.

FIG. 13 depicts generally at 1300 two graphs contrasting a non-linearity of a conventional differential interconnect with a non-linearity of a distributed differential interconnect for an example scenario involving a phase-locked loop. A graph 1302 on the left shows a non-linearity for the conventional differential interconnect. A graph 1304 on the right shows non-linearity for a distributed differential interconnect implementation. Each graph represents an input phase error in picoseconds (ps) along the horizontal abscissa axis and a non-linearity input relative to full scale (fs) along the vertical ordinate axis. The range of the input phase error extends from −250 to +250 picoseconds in both the graph 1302 and the graph 1304. The scale for the non-linearity, however, differs between the two graphs. For the graph 1302, the non-linearity input range extends from −1000 to +400, but the non-linearity input range extends from just −200 to +50 for the graph 1304.

Thus, although the appearance of the two non-linearity plots is somewhat similar, the actual non-linearity is appreciably different. The overall non-linearity can be distilled into one number by determining the area under each non-linearity plot. For the graph 1302 that is representative of a conventional differential interconnect, the overall input non-linearity (inl) has a value of 320 relative to full scale. In contrast, for the graph 1304 that is representative of an implementation of a distributed differential interconnect, the overall input non-linearity (inl) has a value of 64 relative to full scale. In this example comparison, the non-linearity of the example distributed differential interconnect implementation is just 20% of the non-linearity of the conventional differential interconnect. In other words, the non-linearity of the conventional differential interconnect is five times higher. Moreover, a phase-locked loop is frequently operated in the −100 to +100 picosecond input phase error range. In this input phase error range, the reduction in non-linearity provided by the example distributed differential interconnect is even greater.

Figure 14:
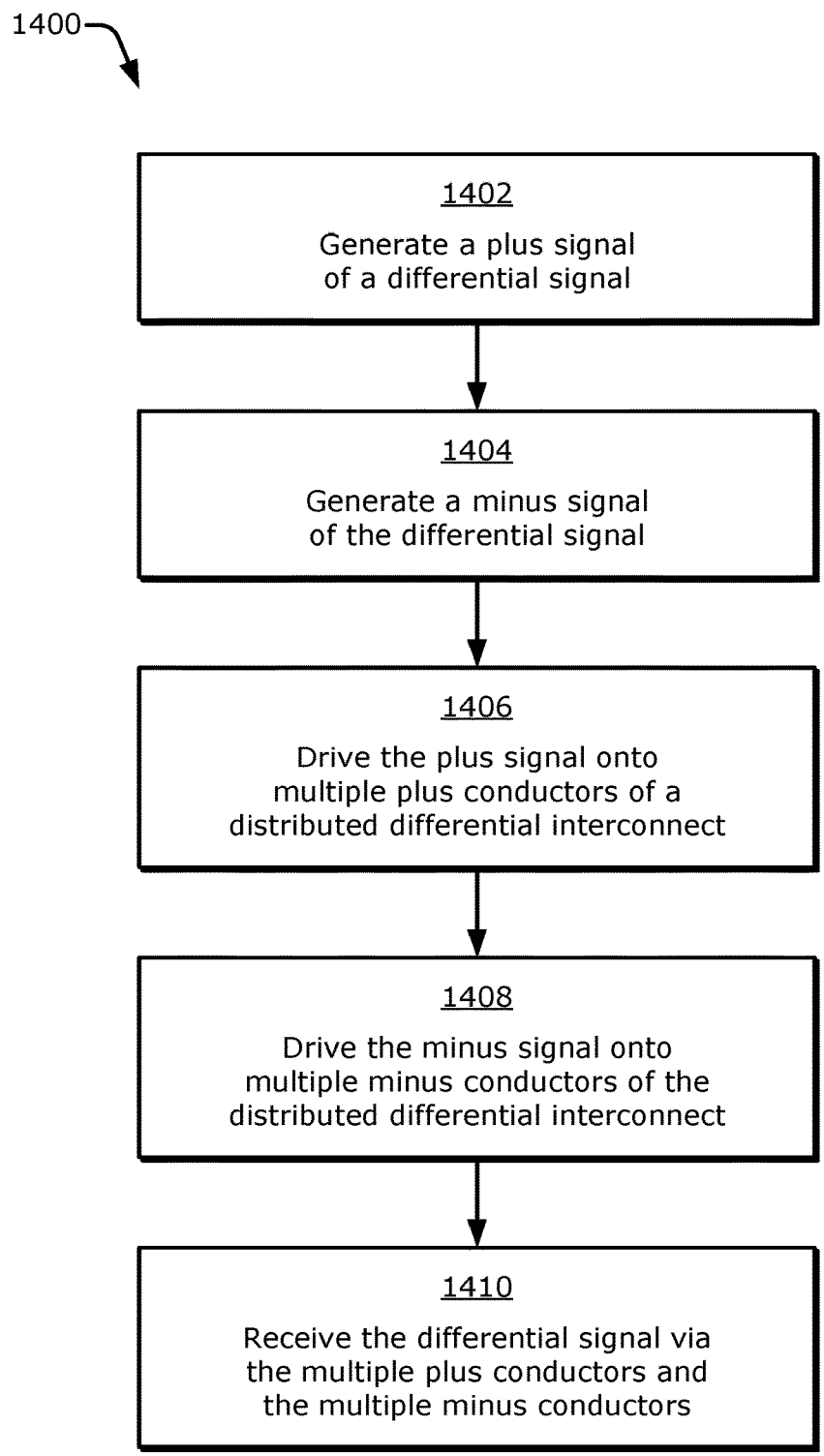
FIG. 14 is a flow diagram illustrating an example process for propagating a differential signal via a distributed differential interconnect.

FIG. 14 is a flow diagram illustrating an example process 1400 for propagating a differential signal via a distributed differential interconnect. The process 1400 is described in the form of a set of blocks 1402-1410 that specify operations that can be performed. However, operations are not necessarily limited to the order shown in FIG. 14 or described herein, for the operations may be implemented in alternative orders or in fully or partially overlapping manners. Operations represented by the illustrated blocks of the process 1400 may be performed by circuitry, such as the circuitry 400 of FIG. 4 or the integrated circuit 1510 of FIG. 15, which is described below. More specifically, the operations of the process 1400 may be performed by a differential driver 116 in conjunction with a differential interconnect 108 (e.g., of FIGS. 2 and 4).

At block 1402, a plus signal of a differential signal is generated. For example, circuitry 400 can generate a plus signal 212 of a differential signal 110. At block 1404, a minus signal of the differential signal is generated. For example, the circuitry 400 can generate a minus signal 214 of the differential signal 110. This generation of the plus signal 212 and the minus signal 214 may be performed by a first endpoint 402 or a differential driver 116. For instance, information may be encoded into two complementary electrical parameters to realize the plus signal 212 and the minus signal 214 of the differential signal 110.

At block 1406, the plus signal is driven onto multiple plus conductors of the distributed differential interconnect. For example, the circuitry 400 can drive the plus signal 212 onto multiple plus conductors 302-1, 302-2, and 302-3 of a distributed implementation of a differential interconnect 108. To do so, a plus driver 206 may distribute the plus signal 212 across the multiple plus conductors 302-1, 302-2, and 302-3 via a plus input node 406.

At block 1408, the minus signal is driven onto multiple minus conductors of the distributed differential interconnect. For example, the circuitry 400 can drive the minus signal 214 onto multiple minus conductors 304-1, 304-2, and 304-3 of the distributed differential interconnect 108. To drive the minus signal 214, a minus driver 208 may distribute the minus signal 214 across the multiple minus conductors 304-1, 304-2, and 304-3 via a minus input node 408.

At block 1410, the differential signal is received via the multiple plus conductors and the multiple minus conductors. For example, the circuitry 400 can receive the differential signal 110 via the multiple plus conductors 302-1, 302-2, and 302-3 and the multiple minus conductors 304-1, 304-2, and 304-3. For instance, a differential receiver 118 may receive the differential signal 110, including the plus signal 212 and the minus signal 214, via the multiple plus conductors 302-1, 302-2, and 302-3 and the multiple minus conductors 304-1, 304-2, and 304-3, respectively.

An example implementation of the receiving at block 1410 can include receiving, with a plus receiver 218, the plus signal 212 via the multiple plus conductors 302-1, 302-2, and 302-3 and receiving, with a minus receiver 220, the minus signal 214 via the multiple minus conductors 304-1, 304-2, and 304-3. The receiving at block 1410 can alternatively or additionally include charging or discharging a capacitor 908.

Example implementations of the process 1400 can further include an operation of propagating in parallel the plus signal 212 along the multiple plus conductors 302-1, 302-2, and 302-3 and the minus signal 214 along the multiple minus conductors 304-1, 304-2, and 304-3. With this propagating, individual plus conductors of the multiple plus conductors are disposed in an interleaved arrangement 300 with individual minus conductors of the multiple minus conductors.

Example implementations of the process 1400 can further involve the minus signal being complementary to the plus signal. The generating of the plus signal at block 1402 and the generating of the minus signal at block 1404 can include encoding information into a difference between the plus signal 212 and the minus signal 214. Additionally, the receiving at block 1410 can include decoding the differential signal 110 to recover the information.

Figure 15:
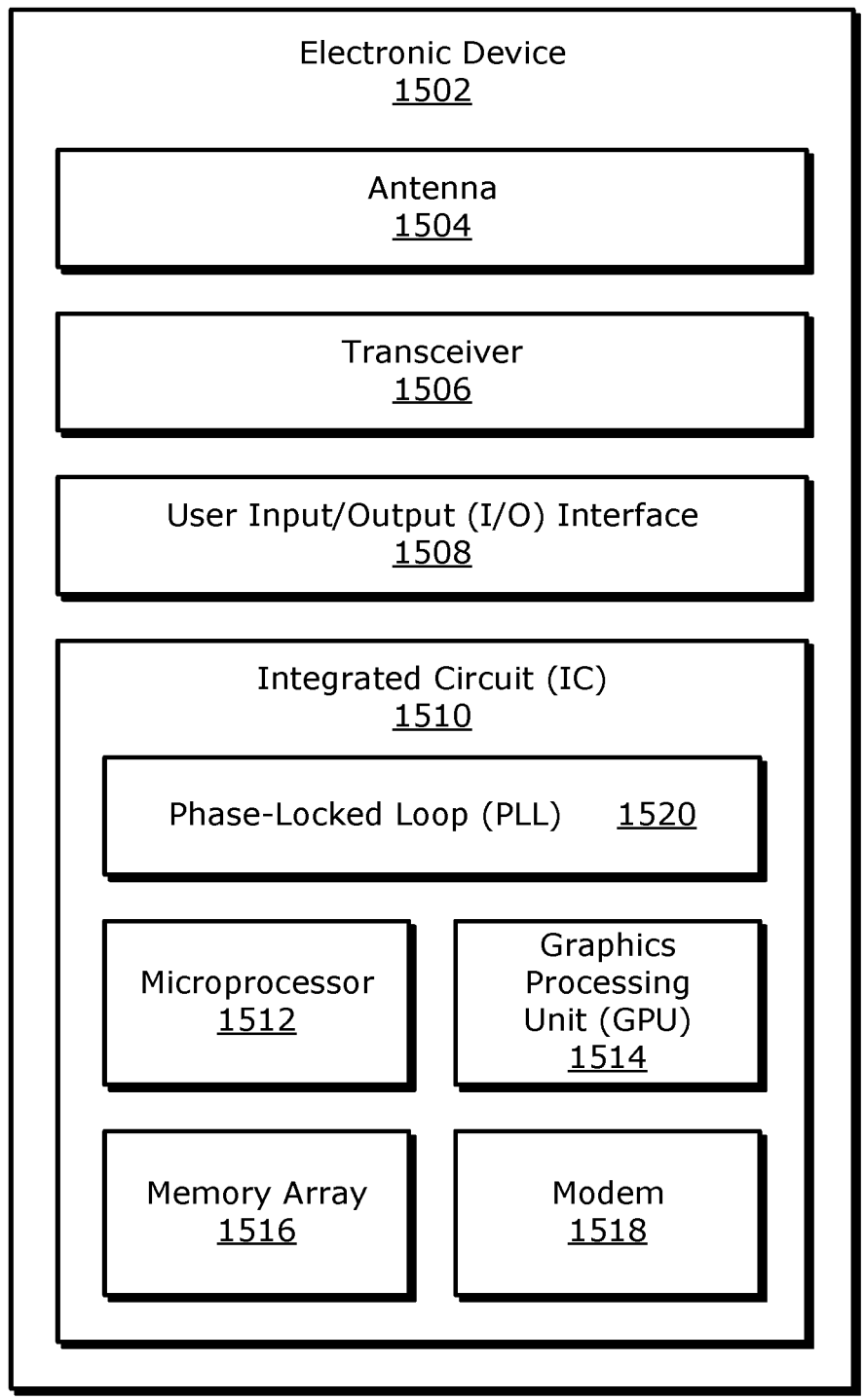
FIG. 15 illustrates an example electronic device that includes an integrated circuit having components in which a distributed differential interconnect can be implemented.

FIG. 15 depicts an example electronic device 1502 that includes an integrated circuit (IC) 1510 having a phase-locked loop 1520 (PLL) and multiple cores. As shown, the electronic device 1502 includes an antenna 1504, a transceiver 1506, and a user input/output (I/O) interface 1508 in addition to the integrated circuit 1510. Illustrated examples of the integrated circuit 1510, or cores thereof, include a microprocessor 1512, a graphics processing unit 1514 (GPU), a memory array 1516, a modem 1518, and the phase-locked loop 1520. In one or more example implementations, a distributed differential interconnect as described herein can be implemented as part of the phase-locked loop 1520. Additionally or alternatively, a distributed differential interconnect as described herein can be implemented in another component of the electronic device 1502, such as the transceiver 1506 or the modem 1518.

The electronic device 1502 can be a mobile or battery-powered device or a fixed device that is designed to be powered by an electrical grid. Examples of the electronic device 1502 include a server computer, a network switch or router, a blade of a data center, a personal computer, a desktop computer, a notebook or laptop computer, a tablet computer, a smart phone, an entertainment appliance, a fixed or mobile wireless device, or a wearable computing device such as a smartwatch, intelligent glasses, or an article of clothing. An electronic device 1502 can also be a device, or a portion thereof, having embedded electronics. Examples of the electronic device 1502 with embedded electronics include a passenger vehicle, industrial equipment, a refrigerator or other home appliance, a drone or other unmanned aerial vehicle (UAV), or a power tool.

For an electronic device with a wireless capability, the electronic device 1502 includes an antenna 1504 that is coupled to a transceiver 1506 to enable reception or transmission of one or more wireless signals. The integrated circuit 1510 may be coupled to the transceiver 1506 to enable the integrated circuit 1510 to have access to received wireless signals or to provide wireless signals for transmission via the antenna 1504. The electronic device 1502 as shown also includes at least one user I/O interface 1508. Examples of the user I/O interface 1508 include a keyboard, a mouse, a microphone, a touch-sensitive screen, a camera, an accelerometer, a haptic mechanism, a speaker, a display screen, or a projector.

The integrated circuit 1510 may include, for example, one or more instances of a microprocessor 1512, a GPU 1514, a memory array 1516, a modem 1518, and so forth. The microprocessor 1512 may function as a central processing unit (CPU) or other general-purpose processor. Some microprocessors include different parts, such as multiple processing cores, that may be individually powered on or off. The GPU 1514 may be especially adapted to process visual-related data for display. If visual-related data is not being rendered or otherwise processed, the GPU 1514 may be fully or partially powered down. The memory array 1516 stores data for the microprocessor 1512 or the GPU 1514. Example types of memory for the memory array 1516 include random access memory (RAM), such as dynamic RAM (DRAM) or static RAM (SRAM); flash memory; and so forth. If programs are not accessing data stored in memory, the memory array 1516 may be powered down overall or block-by-block. The modem 1518 demodulates a signal to extract encoded information or modulates a signal to encode information into the signal. If there is no information to decode from an inbound communication or to encode for an outbound communication, the modem 1518 may be idled to reduce power consumption. The integrated circuit 1510 may include additional or alternative parts than those that are shown, such as an I/O interface, a sensor such as an accelerometer or gyroscope, a transceiver or another part of a receiver chain, a customized or hard-coded processor such as an application-specific integrated circuit (ASIC), and so forth.

The integrated circuit 1510 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 1510 generally, may be termed cores or circuit blocks. Examples of cores or circuit blocks include, in addition to those that are illustrated in FIG. 15, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a processing or GPU core, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An electronic apparatus comprising:
a first endpoint having a first differential connection interface;
a second endpoint having a second differential connection interface; and
a differential interconnect coupled between the first differential connection interface and the second differential connection interface, the differential interconnect including:
a plus pathway extending between the first differential connection interface and the second differential connection interface, the plus pathway including multiple plus conductors; and
a minus pathway extending between the first differential connection interface and the second differential connection interface, the minus pathway including multiple minus conductors,
individual plus conductors of the multiple plus conductors disposed in an interleaved arrangement with individual minus conductors of the multiple minus conductors.

2. The electronic apparatus of claim 1, wherein the individual plus conductors and the individual minus conductors are disposed in a substantially parallel arrangement.

3. The electronic apparatus of claim 1, further comprising:
an integrated circuit that includes a substrate,
wherein the multiple plus conductors and the multiple minus conductors comprise metal lines in a metal layer of the substrate.

4. The electronic apparatus of claim 1, further comprising:
a printed circuit board (PCB) that includes a substrate,
wherein the multiple plus conductors and the multiple minus conductors comprise metal traces on the substrate.

5. The electronic apparatus of claim 1, wherein:
each of the multiple plus conductors and the multiple minus conductors include an input side and an output side;
the first differential connection interface comprises:
a plus input node coupled to the input side of each plus conductor of the multiple plus conductors; and
a minus input node coupled to the input side of each minus conductor of the multiple minus conductors; and
the second differential connection interface comprises:
a plus output node coupled to the output side of each plus conductor of the multiple plus conductors; and
a minus output node coupled to the output side of each minus conductor of the multiple minus conductors.

6. The electronic apparatus of claim 1, further comprising a ground node.

7. The electronic apparatus of claim 6, wherein the ground node comprises at least one of a ground plane or a ground pathway.

8. The electronic apparatus of claim 1, wherein:
the first endpoint comprises a charge pump of a phase-locked loop; and
the second endpoint comprises a capacitor of the phase-locked loop.

9. The electronic apparatus of claim 8, further comprising:
the phase-locked loop, the phase-locked loop comprising:
a phase frequency detector coupled to the charge pump;
the charge pump coupled to the capacitor via the differential interconnect;
a filter comprising the capacitor; and
a voltage-controlled oscillator (VCO) coupled between the filter and the phase frequency detector.

10. The electronic apparatus of claim 9, wherein:
the voltage-controlled oscillator is configured to generate a signal as part of the phase-locked loop; and
the electronic apparatus is configured to provide the signal to one or more other components of the electronic apparatus to facilitate operation of the one or more other components responsive to the signal.

11. The electronic apparatus of claim 1, wherein the first differential connection interface comprises a differential driver configured to drive a differential signal onto the differential interconnect.

12. The electronic apparatus of claim 11, wherein:
the differential signal comprises a plus signal and a minus signal; and
the differential driver comprises:
a plus driver configured to drive the plus signal onto the plus pathway; and
a minus driver configured to drive the minus signal onto the minus pathway.

13. The electronic apparatus of claim 12, wherein the plus signal and the minus signal comprise complementary signals that encode information relative to each other.

14. The electronic apparatus of claim 12, wherein:
the plus driver is configured to distribute the plus signal across the multiple plus conductors of the plus pathway; and
the minus driver is configured to distribute the minus signal across the multiple minus conductors of the minus pathway.

15. The electronic apparatus of claim 12, wherein:
the second differential connection interface comprises a differential receiver configured to receive the differential signal via the differential interconnect; and
the differential receiver comprises:
a plus receiver configured to receive the plus signal via the plus pathway; and
a minus receiver configured to receive the minus signal via the minus pathway.

16. An electronic apparatus comprising:
a first endpoint including a differential driver configured to drive a differential signal;
a second endpoint including a differential receiver configured to receive the differential signal; and
means for propagating the differential signal between the first endpoint and the second endpoint via multiple plus conductors and multiple minus conductors.

17. The electronic apparatus of claim 16, wherein:
the differential signal comprises a plus signal and a minus signal that are complementary to each other; and
the differential driver comprises:
a plus driver configured to drive the plus signal using the means for propagating the differential signal; and
a minus driver configured to drive the minus signal using the means for propagating the differential signal.

18. The electronic apparatus of claim 16, wherein:
the means for propagating the differential signal comprises a differential interconnect that is distributed across the multiple plus conductors and the multiple minus conductors; and the multiple plus conductors are disposed in an interleaved arrangement with respect to the multiple minus conductors.

19. The electronic apparatus of claim 16, wherein:
the means for propagating the differential signal includes multiple adjacent complementary conductors that each include a plus conductor of the multiple plus conductors and a minus conductor of the multiple minus conductors; and
the means for propagating the differential signal comprises means for generating magnetic flux that is additive in regions between adjacent complementary conductors of the multiple adjacent complementary conductors and subtractive beyond the regions between the adjacent complementary conductors.

20. An integrated circuit comprising:
a plus input node;
a minus input node;
a plus output node;
a minus output node; and
a differential interconnect including:
  a first conductor having a plus polarity, the first conductor coupled between the plus input node and the plus output node;
  a second conductor having a minus polarity, the second conductor coupled between the minus input node and the minus output node, the second conductor disposed adjacent to the first conductor;
  a third conductor having the plus polarity, the third conductor coupled between the plus input node and the plus output node, the third conductor disposed adjacent to the second conductor; and
  a fourth conductor having the minus polarity, the fourth conductor coupled between the minus input node and the minus output node, the fourth conductor disposed adjacent to the third conductor.

21. The integrated circuit of claim 20, wherein the first conductor, the second conductor, the third conductor, and the fourth conductor are disposed in a same plane.

22. The integrated circuit of claim 20, further comprising:
a differential driver coupled to the plus input node and the minus input node, the differential driver configured to drive a differential signal over the differential interconnect.

23. The integrated circuit of claim 22, further comprising:
a ground node, wherein:
the differential signal comprises a plus signal and a minus signal; and
the differential driver comprises:
  a plus driver coupled to the plus input node and configured to drive the plus signal over the first conductor and the third conductor; and
  a minus driver coupled to the minus input node and configured to drive the minus signal over the second conductor and the fourth conductor.

24. The integrated circuit of claim 22, wherein:
the first conductor, the second conductor, the third conductor, and the fourth conductor each have a substantially common width;
the first conductor and the second conductor comprise a first pair of conductors, the second conductor and the third conductor comprise a second pair of conductors, and the third conductor and the fourth conductor comprise a third pair of conductors; and
the first pair of conductors, the second pair of conductors, and the third pair of conductors each define an intervening space.

25. A method for propagating a differential signal via a distributed differential interconnect, the method comprising:
generating a plus signal of the differential signal;
generating a minus signal of the differential signal;
driving the plus signal onto multiple plus conductors of the distributed differential interconnect;
driving the minus signal onto multiple minus conductors of the distributed differential interconnect; and
receiving the differential signal via the multiple plus conductors and the multiple minus conductors.

26. The method of claim 25, wherein the receiving comprises:
receiving the plus signal via the multiple plus conductors; and
receiving the minus signal via the multiple minus conductors.

27. The method of claim 25, wherein:
the driving the plus signal comprises distributing the plus signal across the multiple plus conductors via a plus input node; and
the driving the minus signal comprises distributing the minus signal across the multiple minus conductors via a minus input node.

28. The method of claim 25, wherein:
the minus signal is complementary to the plus signal;
the generating the plus signal and the generating the minus signal comprise encoding information into a difference between the plus signal and the minus signal; and
the receiving comprises decoding the differential signal to recover the information.

29. The method of claim 25, wherein the receiving comprises charging a capacitor.

30. The method of claim 25, further comprising propagating in parallel the plus signal along the multiple plus conductors and the minus signal along the multiple minus conductors, with individual plus conductors of the multiple plus conductors disposed in an interleaved arrangement with individual minus conductors of the multiple minus conductors.

* * * * *